US012278224B2

(12) United States Patent
Feuillet et al.

(10) Patent No.: US 12,278,224 B2
(45) Date of Patent: Apr. 15, 2025

(54) METHOD FOR PRODUCING NITRIDE MESAS EACH INTENDED TO FORM AN ELECTRONIC OR OPTOELECTRONIC DEVICE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Guy Feuillet, Grenoble (FR); Blandine Alloing, Valbonne (FR); Hubert Bono, Grenoble (FR); Roy Dagher, Grenoble (FR); Jesus Zuniga Perez, Biot (FR); Matthew Charles, Grenoble (FR); Julien Buckley, Grenoble (FR); Rene Escoffier, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 487 days.

(21) Appl. No.: 17/620,484

(22) PCT Filed: Jun. 22, 2020

(86) PCT No.: PCT/EP2020/067382
§ 371 (c)(1),
(2) Date: Dec. 17, 2021

(87) PCT Pub. No.: WO2020/254695
PCT Pub. Date: Dec. 24, 2020

(65) Prior Publication Data
US 2022/0359479 A1    Nov. 10, 2022

(30) Foreign Application Priority Data
Jun. 21, 2019 (FR) .................................... 19 06756

(51) Int. Cl.
H01L 25/16    (2023.01)
H01L 21/02    (2006.01)
(Continued)

(52) U.S. Cl.
CPC ........ H01L 25/167 (2013.01); H01L 21/0265 (2013.01); H01L 21/786 (2013.01);
(Continued)

(58) Field of Classification Search
CPC ... C30B 25/183; C30B 29/40; H01L 21/0237; H01L 21/02458; H01L 21/0254; H01L 21/0265; H01L 29/66462
See application file for complete search history.

(56) References Cited

U.S. PATENT DOCUMENTS

| 6,261,929 | B1 * | 7/2001 | Gehrke | ............. H01L 21/02639 |
| | | | | 257/E21.123 |
| 2010/0072576 | A1 * | 3/2010 | Arena | ............... H01L 21/02521 |
| | | | | 438/459 |

(Continued)

OTHER PUBLICATIONS

International Search Report issued on Sep. 17, 2020 in PCT/EP2020/067382 filed on Jun. 22, 2020, 2 pages.

(Continued)

*Primary Examiner* — Nelson Garces
(74) *Attorney, Agent, or Firm* — Oblon, McClelland, Maier & Neustadt, L.L.P.

(57) ABSTRACT

A method for obtaining mesas that are made at least in part of a nitride (N), the method includes providing a stack comprising a substrate and at least the following layers disposed in succession from the substrate a first layer, referred to as the flow layer, and a second, crystalline layer, (Continued)

referred to as the crystalline layer; forming pads by etching the crystalline layer and at least one portion of the flow layer such that: —each pad includes at least: —a first section, referred to as the flow section, formed by at least one portion of the flow layer, and a second, crystalline section, referred to as the crystalline section, framed by the crystalline layer and overlying the flow section, the pads are distributed over the substrate so as to form a plurality of sets of pads; and epitaxially growing a crystallite on at least some of said pads and continuing the epitaxial growth of the crystallites until the crystallites carried by the adjacent pads of the same set coalesce.

24 Claims, 26 Drawing Sheets

(51) Int. Cl.
H01L 21/786 (2006.01)
H01L 25/07 (2006.01)
H01L 29/66 (2006.01)
H01L 33/00 (2010.01)
H01L 23/00 (2006.01)
H01L 29/778 (2006.01)

(52) U.S. Cl.
CPC ...... *H01L 25/072* (2013.01); *H01L 29/66462* (2013.01); *H01L 33/0093* (2020.05); *H01L 24/29* (2013.01); *H01L 24/32* (2013.01); *H01L 24/83* (2013.01); *H01L 29/7786* (2013.01); *H01L 33/007* (2013.01); *H01L 2224/29124* (2013.01); *H01L 2224/29166* (2013.01); *H01L 2224/29184* (2013.01); *H01L 2224/29186* (2013.01); *H01L 2224/32145* (2013.01); *H01L 2224/83203* (2013.01)

(56) References Cited

U.S. PATENT DOCUMENTS

| 2010/0109126 | A1* | 5/2010 | Arena | H01L 29/0684 |
| | | | | 257/E29.089 |
| 2011/0316000 | A1* | 12/2011 | Beaumont | H01L 21/0262 |
| | | | | 257/E29.089 |
| 2012/0319128 | A1 | 12/2012 | Arena | |
| 2014/0312463 | A1 | 10/2014 | Arena | |
| 2018/0219087 | A1* | 8/2018 | Dasgupta | H01L 21/02639 |

OTHER PUBLICATIONS

Zubia et al., "Nanoheteroepitaxial growth of GaN on Si by organometallic vapor phase epitaxy", Applied Physics Letters, 2000, vol. 76, No. 7, pp. 858-860, XP012025868.
Cao et al., "Electrical effects of plasma damage in p-GaN", Applied Physics letters, 1999, vol. 75, 1 page, https://doi.org/10/1063/1.125080 (submitting English Abstract only).
Kodera et al., "Impact of Plasma-Damaged-Layer Removal on GaN HEMT Devices", physics status solidi (a), 2017, vol. 215, Issue 9, 1 page, https://doi.org/10.1002/pssa.201700633.
Feenstra et al., "Review of Structure of Bare and Adsorbate-Covered GaN(0001) Surfaces", MRS Internet Journal Nitride Semiconductor Research, 2002, vol. 7, No. 3, pp. 1-27.
Chang et al., "The Variation of Ohmic Contacts and Surface Characteristics on p-GaN Induced by Reactive Ion Etching", J. Electrochem. Soc., 2002, vol. 149, 3 total pages, https://doi.org/10.1149/1.1479161 (submitting English Abstract only).

* cited by examiner

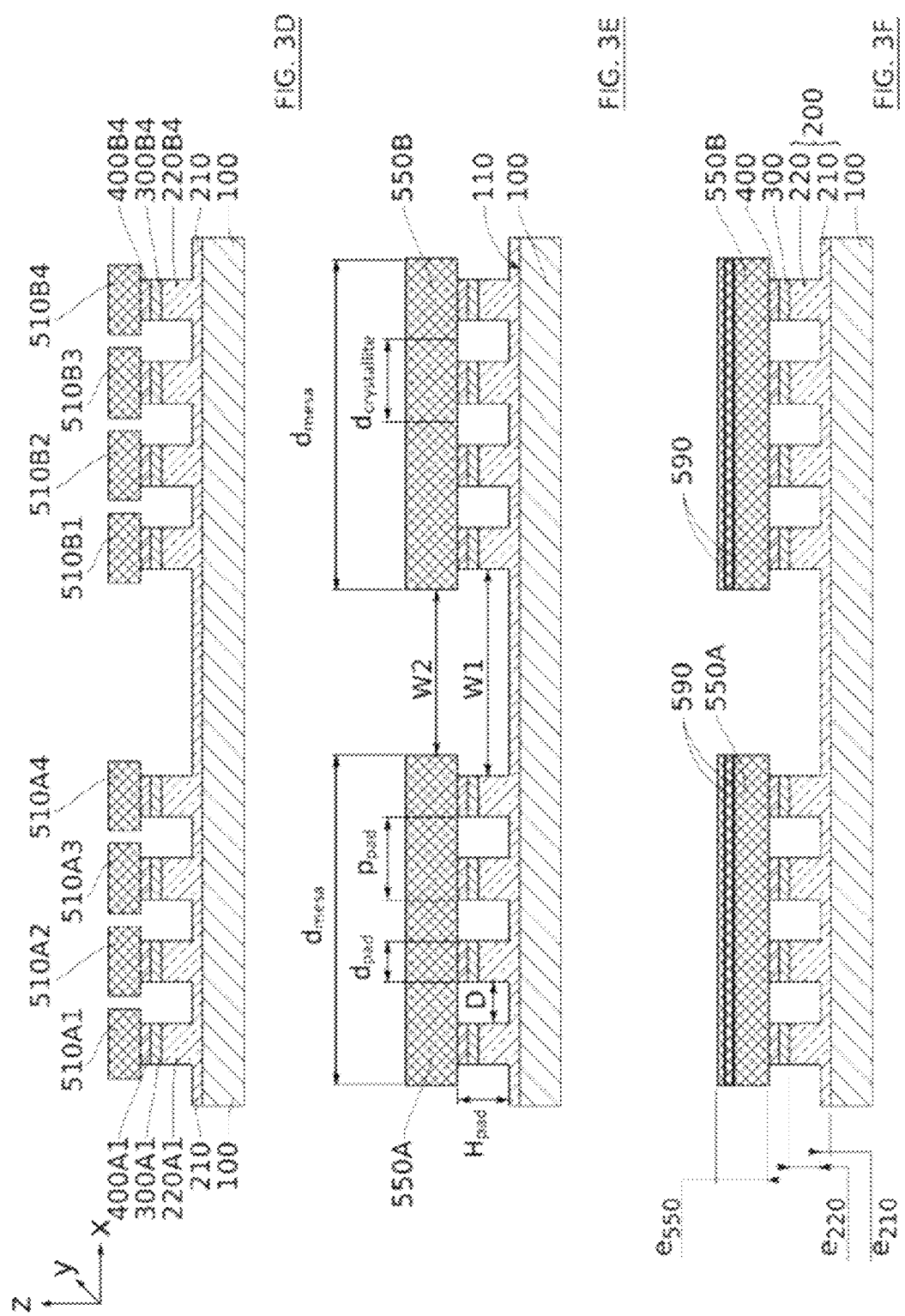

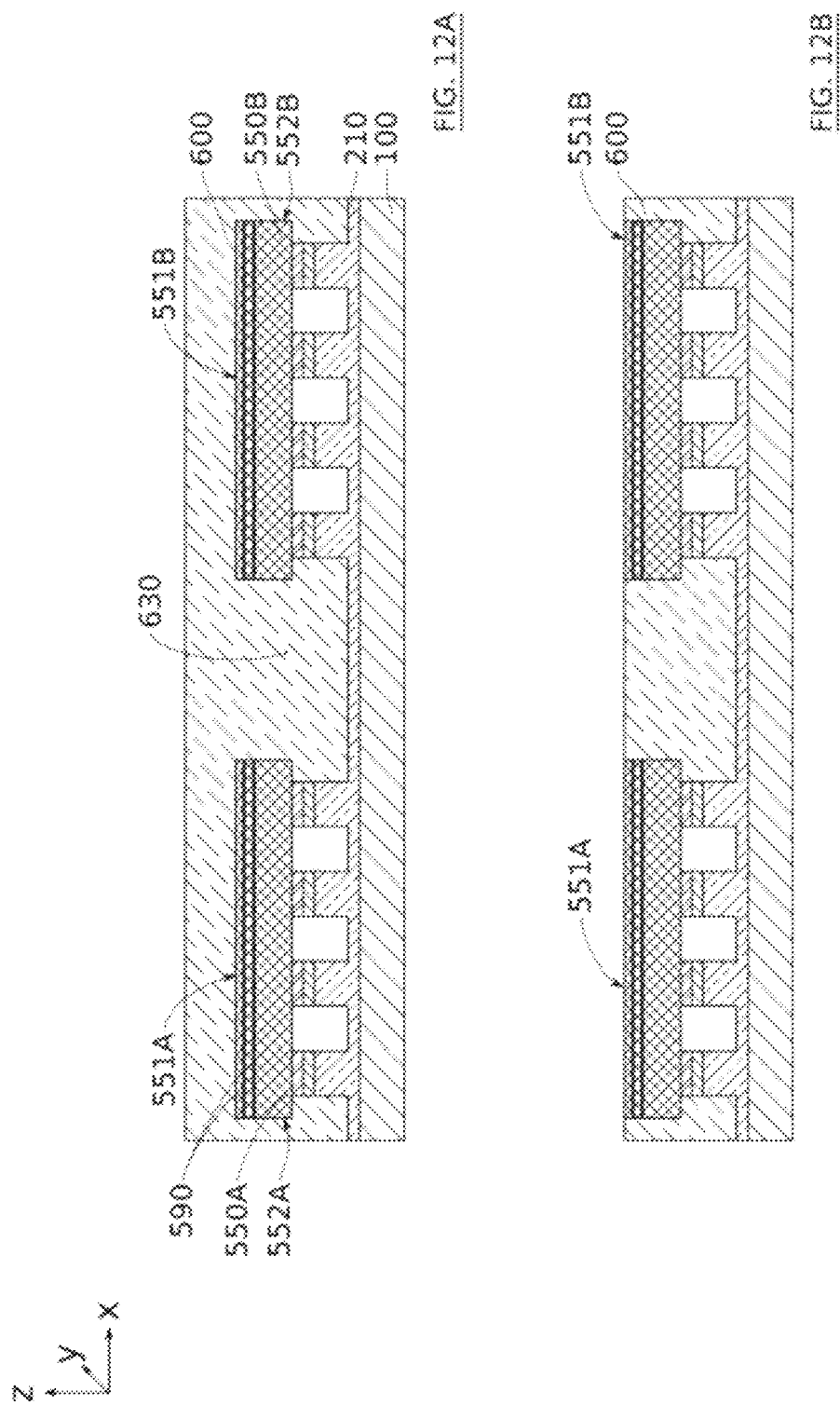

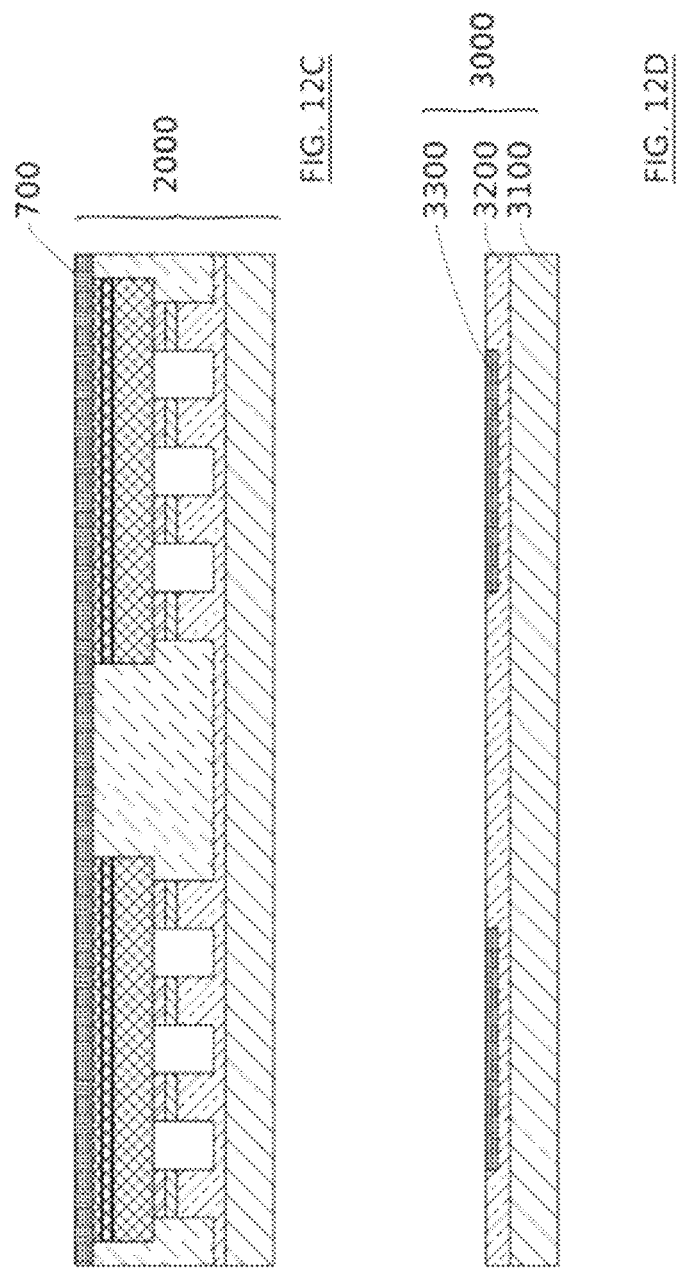

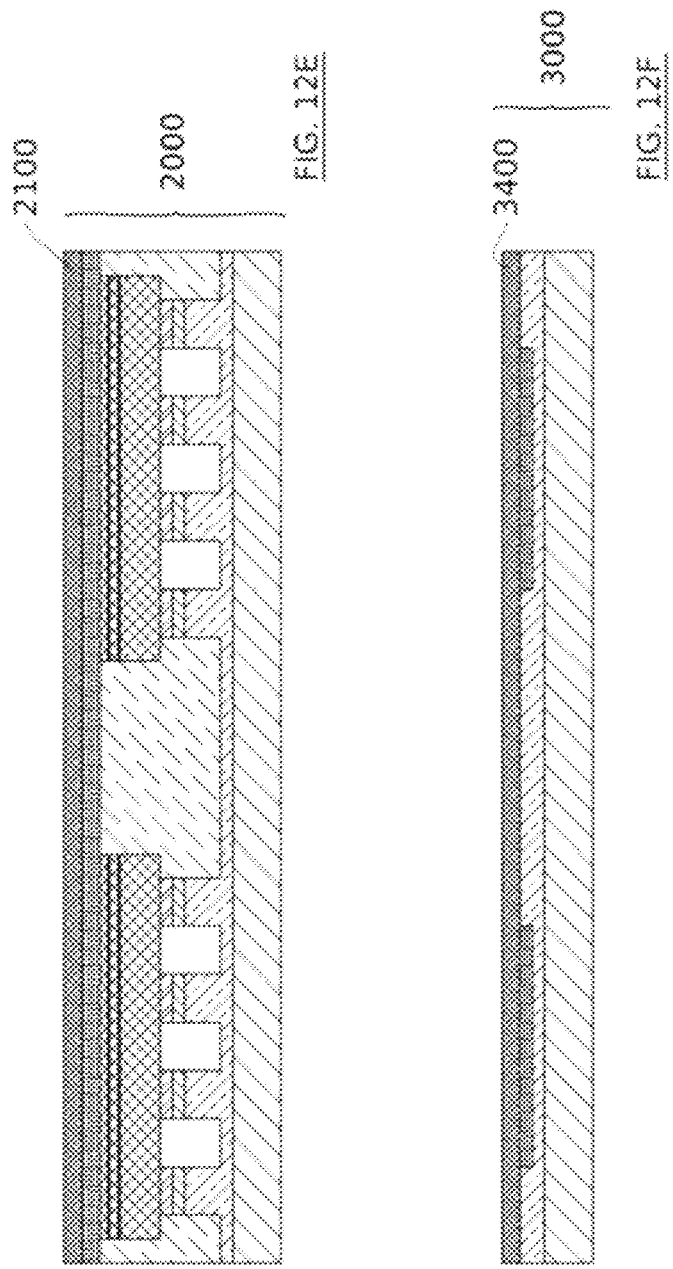

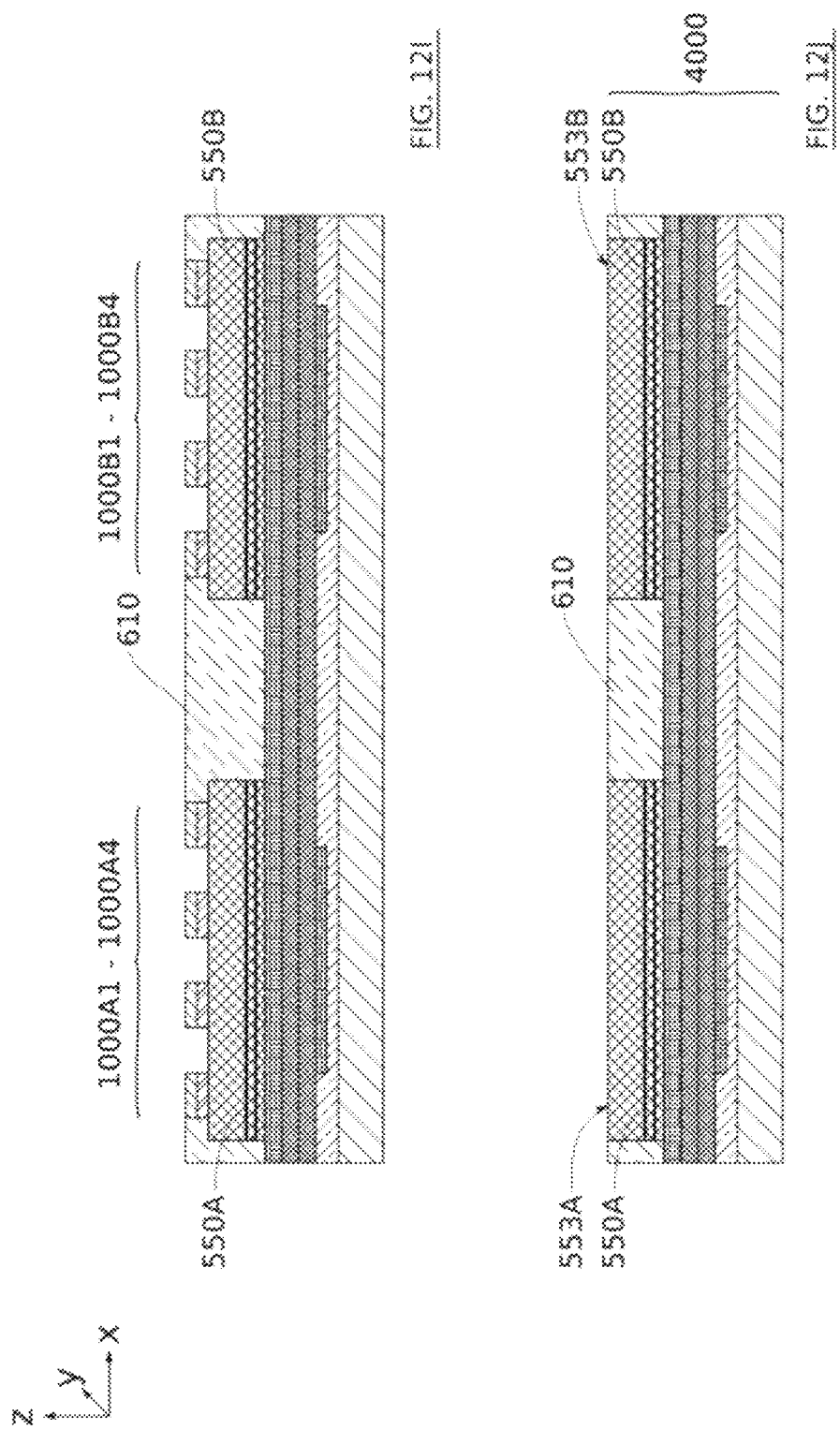

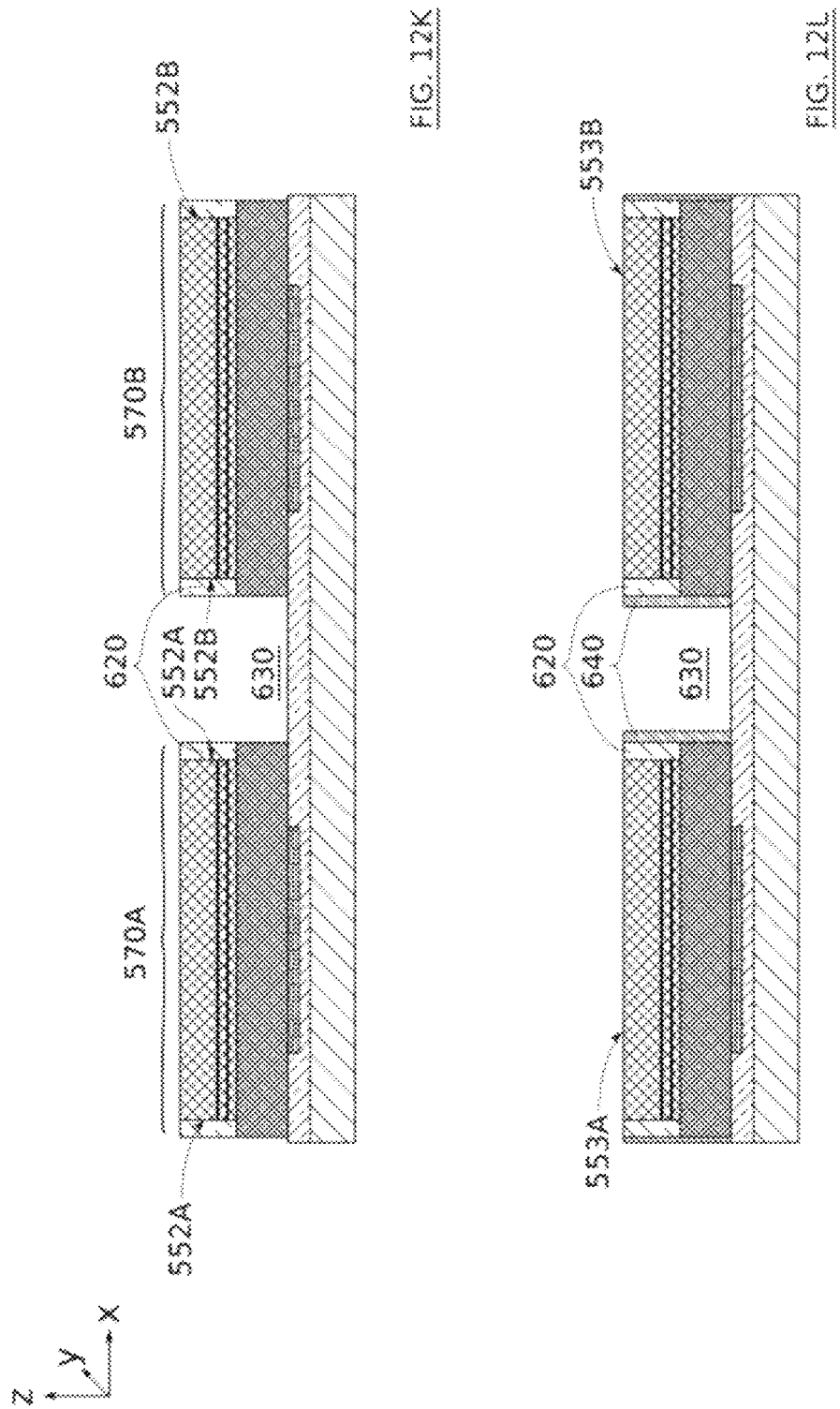

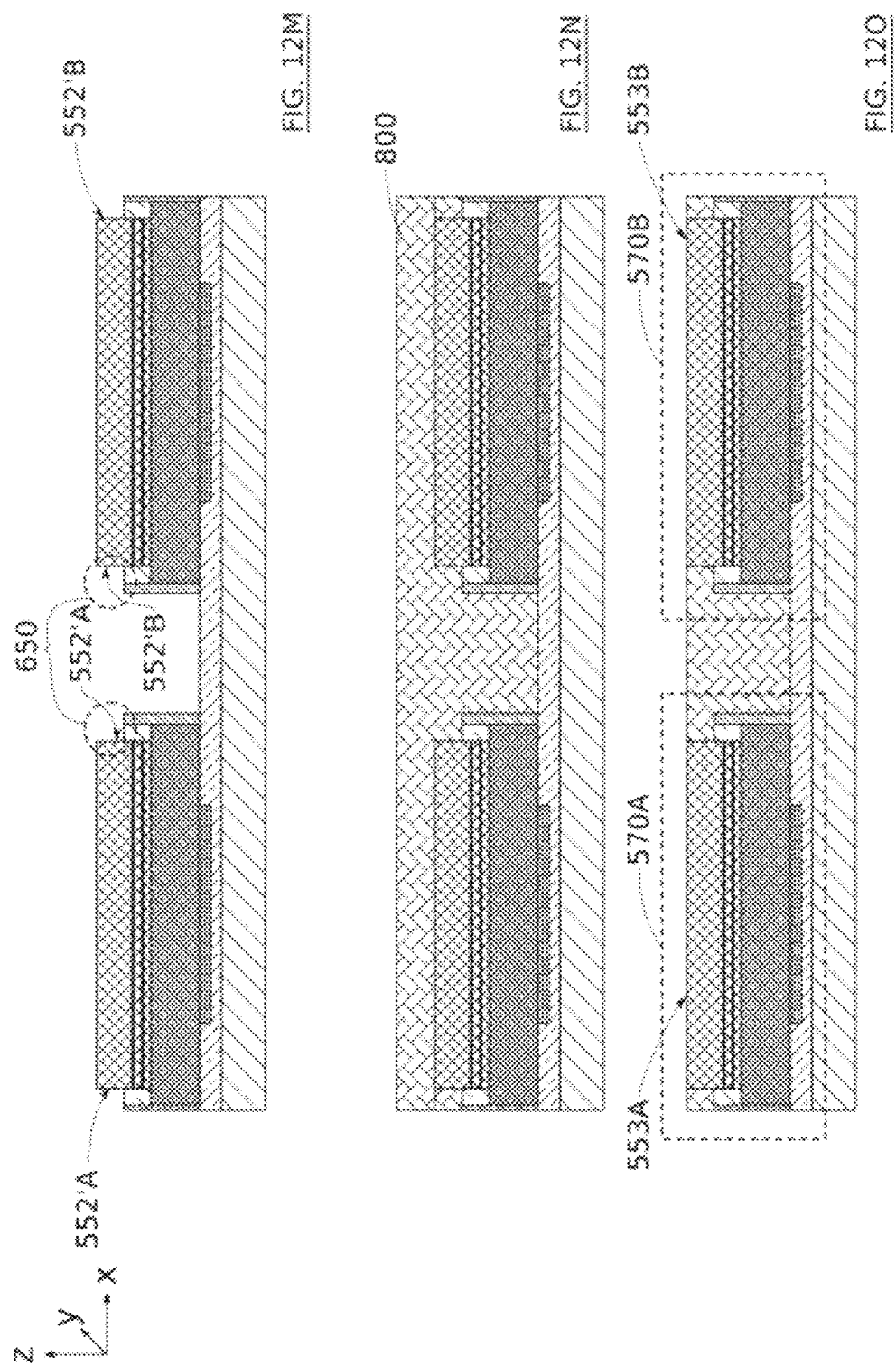

METHOD FOR PRODUCING NITRIDE MESAS EACH INTENDED TO FORM AN ELECTRONIC OR OPTOELECTRONIC DEVICE

TECHNICAL FIELD

The invention relates to the production of mesas made of a nitride (N) preferably obtained from at least one material selected from gallium (Ga), indium (In) and aluminium (Al). One example application of the invention lies in the field of optoelectronic devices comprising a plurality of micro-sized light-emitting diodes (LEDs), generally referred to as micro-LEDs. In this field, one particularly advantageous use of the invention involves producing small displays generally referred to as microdisplays.

PRIOR ART

Micro-LED-based optoelectronic devices comprise a substrate overlaid by a plurality of micro-LEDs spaced apart from one another. These optoelectronic devices are typically formed by carrying out the steps briefly described hereinbelow and diagrammatically illustrated in FIGS. 1A and 1B:
- a first step consists in obtaining a nitride layer 500, typically a gallium nitride (GaN) layer. This type of nitride is conventionally obtained by epitaxial growth from a crystalline layer 300. This step is shown in FIG. 1A.
- a second step consists in spatially delimiting mesas 550A-550E in the full-wafer epitaxially-grown nitride layer 500 on the crystalline layer 300. This spatial delimitation is carried out, for example, by RIE (reactive ion etching) 10. Each of these mesas 550A-550E is intended to form a micro-LED 570A-570D. For this purpose, quantum wells 590 can, for example, be produced in each of the mesas 550A-550E in order to form the micro-LEDs 570A-570D.

One drawback of these optoelectronic devices is that the external quantum efficiency of these micro-LEDs is highly dependent on the size thereof. This is clearly shown in the graph in FIG. 2A. This graph clearly shows that, as the size of the micro-LED decreases, the external quantum efficiency also decreases. This decrease in efficiency is particularly significant for micro-LEDs with a lateral dimension of less than 50 μm ($10^{-6}$ metres), the lateral dimension being the length of the sides of a micro-LED with a square or rectangular top face. The lengths of the sides of the top face of a micro-LED thus determine the perimeter of this top face.

FIG. 2B is a cathodoluminescence image recorded at room temperature of a micro-LED with a lateral dimension of 7 μm. This figure clearly shows that this decrease in efficiency of the micro-LEDs is associated with a lower luminescence of the edges of the LED. FIG. 2O is a graph comparing the cathodoluminescence profiles at temperatures of 300 K (kelvin) and at 8 K. This figure clearly shows that as the temperature increases, at the micro-LED edge, the excitons located at low temperature are delocalised towards the non-radiative recombination centres.

This edge effect becomes more important as the perimeter-to-area ratio, which is approximately proportional to the inverse of the size of the micro-LED, increases. This is clear from FIG. 2D. This figure shows the variation of the Shockley-Read-Hall (SRH) recombination parameter A as a function of this perimeter-to-area ratio.

This edge effect is very likely related to the defects left by the etching 10, which is intended to spatially delimit the individual mesas 550A-550E in the full-wafer epitaxially-grown layer 500 on the substrate 300 thereof. More specifically, the etching 10, for example of the RIE type, alters the periphery of the mesas 550A-550E intended to form each micro-LED 570A, 570B. These altered zones are given the reference numerals 520A, 520B in FIG. 1C, which is an enlargement of zone A referenced in FIG. 1B. At the quantum wells 590 formed in the micro-LEDs 570A-570D, these non-radiative defects trap the carriers, preventing them from radiatively recombining, which lowers the efficiency of the micro-LEDs 570A-570D.

Several solutions have been proposed to address this issue.

A first possible solution consists in optimising the available surface area of the pixel by producing micro-LEDs having a surface area that is close to that of the pixel pitch, and having a geometry that minimises the PIS ratio, P being the pixel pitch and S being the surface area of the micro-LED associated with the pixel. One drawback of this solution is that the proximity of the pixels increases the so-called cross-talk effects between pixels.

A second solution consists in forcing the injection of the carriers into the centre of the micro-LED, such that the carriers cannot diffuse to the edges of the micro-LED. For this purpose, the p-type contact can be provided such that it does not occupy the entire surface area of the GaN forming the micro-LED. This requires the diffusion length of the carriers in the GaN to be less than the distance between the edge of the p-contact and the edge of the pixel. The carriers thus do not reach the edges of the pixel. However, this solution has the drawback of inducing a significant loss of emissive surface area, especially in the case of micro-LEDs. For the same surface area, a display with these micro-LEDs will thus have a lower light intensity.

In general, etching techniques are known to cause problems. The adverse effects thereof concern a plurality of aspects: surface roughening, chemical contamination linked to the chemistry of the gases used, levels associated with nitrogen vacancies, etc. In particular, it has been shown that p-doped (Mg) GaN surfaces are impacted by ICP etching (inductively coupled plasma etching), which induces a very clear reduction in the concentration of acceptors in the zones close to the surface. This is explained in particular in the publication entitled "Electrical effect of plasma damage in p-GaN Induced by Reactive Ion Etching" Cao et al. Appl. Phys. Lett. 75, 2569, (1999).

It has also been shown that RIE or ICP etching induces trap levels in the GaN gap. This is explained in particular in the publication by Kodera et al. PSS. A 2017, 1700633 "Impact of Plasma damaged layer removal on GaN HEMT devices". The oxygen concentration is also increased by a factor of 3 in the zone impacted by the dry etching, probably due to the oxidation of the surface layers, in correlation with the appearance of nitrogen substoichiometry. Moreover, the surface zone becomes amorphous over a few nm (10-9 metres). The same publication by Kodera et al. shows that an appropriate post-etching chemical treatment reduces the negative effects of the etching. SIMS analysis (Secondary-Ion Mass Spectrometry) shows, however, that the removal of surface impurities induced by etching is not complete.

The effects of RIE have also been studied to determine whether contacts on etched surfaces can be reworked. A p-type contact with a resistance compatible with the applications appears impossible to obtain on an etched surface. RTA (Rapid Thermal Annealing) improves the contact, however does not recover ohmic contacts. This has in particular been shown in the publication by Chang et al. "The Variation of Ohmic Contacts and Surface Characteristics", J. of the Electrochemical Society 149 No. 7 (G367-G369) 2002.

In order to overcome these problems in the case of micro-LEDs, methods can be implemented for passivating the etched sidewalls. These methods consist in depositing an SiO2-type layer on the etched sidewalls to prevent any non-radiative recombination on the edges of the mesas 550A-550E. In addition to the fact that this should be associated with a preliminary chemical treatment to eliminate (only partially) the defect zone, this adds additional technological steps that are difficult to control. This tends to significantly increase the complexity and cost of producing micro-LEDs.

As described hereinabove, known solutions for forming mesas made of a nitride (N) preferably obtained from at least one material selected from gallium (Ga), indium (In) and aluminium (Al), create numerous problems when these mesas are used to form micro-LEDs. These known solutions further create problems when the mesas are used to produce power electronic devices such as power transistors, for example HEMTs (High Electron Mobility Transistors). In practice, these known solutions for producing mesas result in relatively low electrical performance levels for HEMTs.

There is thus a need to limit or even eliminate the drawbacks of the known solutions. The purpose of the present invention is in particular to provide a solution to this problem.

Another purpose of the present invention is to provide a solution for obtaining, on the surface of a substrate, a plurality of micro-LEDs with improved brightness and/or a very high resolution.

Another purpose of the present invention is to provide a solution for improving the electrical performance levels of power devices, for example HEMTs.

Other purposes, features and advantages of the present invention will appear upon reading the following description and the accompanying drawings. It is understood that other advantages can be incorporated therein.

SUMMARY

To achieve this purpose, according to one embodiment, the present invention provides a method for obtaining a plurality of mesas, each intended to form an electronic or optoelectronic device. Each mesa is made at least in part of a nitride (N) preferably obtained from at least one material selected from gallium (Ga), indium (In) and aluminium (Al).

The method comprises the following successive steps:
providing a stack comprising a substrate and at least the following layers disposed in succession from the substrate:
 a first layer, referred to as the flow layer, made of a material with a glass transition temperature, the flow layer having a glass transition temperature $T_{glass\ transition}$,
 a second, crystalline layer, referred to as the crystalline layer, which is different from the flow layer,
forming pads by etching at least the crystalline layer and at least one portion of the flow layer such that:
 each pad includes at least:
  a first section, referred to as the flow section, formed by at least one portion of the flow layer,
  a second, crystalline section, referred to as the crystalline section, formed by the crystalline layer and overlying the flow section,
 the pads are distributed over the substrate so as to form a plurality of sets of pads,
epitaxially growing a crystallite on at least some of said pads and:
 continuing the epitaxial growth of the crystallites until the crystallites carried by the adjacent pads of the same set coalesce to form a nitride mesa on each set,
 interrupting the epitaxial growth of the crystallites before crystallites belonging to two separate sets start to coalesce, so that the mesas of each set are apart from one another.

Thus, the proposed method provides for producing nitride (for example GaN) mesas from sets of pads etched in a stack comprising a crystalline layer intended for the epitaxial growth of the nitride and a flow layer. During their epitaxial growth, the crystallites formed at the top of the pads of the same set of pads come together to form a mesa, each of the mesas being intended to form an optoelectronic device such as a micro-LED for example or an electronic device such as a power transistor, for example of the HEMT type.

As will be described in more detail hereafter, the use of these pad arrays allows for the epitaxial formation of nitride mesas with few or no dislocations. More specifically, the use of sets of pads makes it possible to benefit from the flow properties of certain pad materials at the epitaxy temperature in order to align the nitride crystallites that grow by pendeo-epitaxy from adjacent pads to form the mesas, without forming coalescence defects.

More specifically, during epitaxy, the portion of the pad that is formed by the flow section reaches (or exceeds) the glass transition temperature thereof or a temperature very close thereto. Under the force of a mechanical stress, this portion of the pad can thus deform. Thus, when two crystallites that are supported by the same set of pads come into contact and coalesce, the mechanical stresses generated by this contact are transferred to the pads and thus to the flow sections. The latter deform, thereby absorbing some or all of the mechanical stresses. The occurrence and propagation of dislocations at the coalescence boundaries between the crystallites that form a nitride mesa can thus be greatly reduced or even prevented.

In particular, if the crystallites are misoriented relative to one another in the plane in which the substrate mainly lies (known as a "twist") or out of this plane (known as a "tilt"), the misorientation between crystallites results in the creation of a grain boundary during coalescence. This grain boundary is highly energetic as it results from the overlaying of the stress fields of the defects that compose it. If the crystallites grow on pads that can deform as allowed by the method described, then adjacent crystallites become oriented in-plane or out-of-plane to minimise the total energy of the system without the formation of grain boundaries. Conversely, if the crystallites grow on pads that cannot deform (as would be the case with prior art methods of the pendeo-epitaxy or ELOG (Epitaxial Lateral Over Growth) type, grain boundaries are formed and dislocations appear.

Thus, the described method offers a solution that is clearly the reverse of all of the prior art solutions presented hereinabove, which provide for delimiting, by etching, mesas from an initial common layer obtained by epitaxy. The proposed method makes it possible to completely dispense with any etching step for delimiting the mesas. Moreover, as indicated hereinabove, this etching step greatly hinders the efficiency of the micro-LEDs. Furthermore, the solutions developed to reduce, but not eliminate, the drawbacks of this etching considerably complicate the methods and result in other drawbacks. The solution proposed within the scope of the present invention is thus based on a simple and easily reproducible method, which makes it possible to obtain mesas that have not been altered by etching methods and that have no or very few defects related to coalescence boundaries. The invention thus makes it possible to considerably increase the efficiency of the micro-LEDs obtained from these mesas.

This solution thus allows the brightness of high-resolution displays produced from these micro-LEDs to be improved. More specifically, it allows micro-LEDs of very small sizes to be obtained. The dimensions of the mesas are determined by the pad array. Mesas measuring a few μm to a few hundred μm ($10^{-6}$ metres) can be produced using this method.

The dislocation density in these GaN mesas is less than or in the order of 1 to 2 $10^{E}8/cm^2$. The radiative efficiency of the quantum wells is very high.

The precision of the methods implemented to produce the pad array will at least partially determine the smallest possible dimension of the micro-LEDs and thus the resolution of a display comprising these micro-LEDs. For example, for pad arrays produced by nanoimprinting and e-beam lithography, pad sizes of 50 nm and periods of 150-200 nm can be achieved. Mesa sizes of 1 to 2 μm can thus be obtained. This corresponds to the pixel sizes sought for high-resolution microdisplays (often referred to as μ-displays).

Furthermore, this method allows for the direct production of micro-LEDs, each with a size that corresponds to the initial size of the mesa, in particular if a quantum well heterostructure is built on these nitride mesas.

The proposed method thus allows micro-LEDs of very small sizes and high brightness to be obtained. This method is thus particularly advantageous for producing high-resolution, high-brightness displays.

The proposed method can also be implemented to obtain mesas used to manufacture power electronic devices such as transistors of the HEMT type for example. The mesas obtained have a reduced dislocation rate and improved crystalline quality, which improve the electrical performance levels of the power devices.

The invention thus allows nitride (N) layers to be obtained from at least one material selected from gallium (Ga), indium (In) and aluminium (Al), with a significantly reduced dislocation density.

As a result, the method according to the invention offers a particularly effective solution to the problem concerning the generation of coalescence-caused defects. This method, in particular when applied to crystallites produced on SaI (silicon-on-insulator) type substrates and of nanometric dimensions, results in a very significant reduction in the density of coalescence-caused defects, allowing pseudo-substrates to be produced with very low dislocation densities.

Another aspect of the present invention relates to a method for forming a plurality of light-emitting diodes (LEDs) comprising at least the following successive steps of:
forming a plurality of mesas, each intended to form an LED, the plurality of mesas being obtained by implementing the method described hereinabove,
producing at least one of the following in the mesas:
at least one pin junction,
at least one quantum well.

Another aspect of the present invention relates to a microelectronic device comprising a substrate overlaid by a plurality of mesas, each made of a nitride (N) preferably obtained from at least one material selected from gallium (Ga), indium (In) and aluminium (Al). The device further comprises a plurality of pads extending between the substrate and the plurality of mesas, each mesa being fully supported by a set of pads from among said plurality of pads. Each pad comprises at least:
a first section, referred to as the flow section, having a glass transition temperature $T_{glass\ transition}$,
a second section, referred to as the crystalline section, formed by a crystalline material, the flow section and the crystalline section being disposed in succession from the substrate.

The material of the flow section and said nitride from which the mesas are made are chosen such that:

$$T_{epitaxy} \geq k1 \times T_{glass\ transition}, \text{ where } k1=0.8,$$

$T_{epitaxy}$ being the minimum temperature for the epitaxial formation of said nitride from which the mesas are made.

Thus, each mesa comprises or is formed by a continuous layer of nitride (N), preferably obtained from at least one material selected from gallium (Ga), indium (In) and aluminium (Al). Each mesa is fully supported by pads during the epitaxial growth, i.e. during the formation of the mesa.

Another aspect of the present invention relates to an optoelectronic system comprising a microelectronic device as described hereinabove, wherein at least some and preferably each mesa partially forms at least one light-emitting diode (LED).

Another aspect of the present invention relates to a system comprising a microelectronic device as described hereinabove, wherein at least some and preferably each mesa partially forms at least one transistor, preferably a high electron mobility transistor (HEMT).

BRIEF DESCRIPTION OF THE FIGURES

The aims, purposes, features and advantages of the invention will be better understood upon reading the detailed description given of one embodiment thereof, which is illustrated by means of the following accompanying drawings, in which:

FIG. 1A shows the starting stack comprising a continuous nitride layer.

FIG. 1B shows an etching step for structuring separate mesas in the continuous layer.

FIG. 1C is an enlarged view of FIG. 1A showing the defect zones generated by the etching.

FIG. 2A is a graph showing the quantum efficiency of an LED as a function of its size.

FIG. 2B is a cathodoluminescence image of a micro-LED which clearly shows that the decrease in efficiency of these LEDs is associated with less luminescence from the edges of the LED.

FIG. 2C is a graph comparing the cathodoluminescence profiles at two different temperatures.

FIG. 3A to 3F show steps of a method according to a non-limiting example of the method according to the present invention.

FIG. 3A shows one example of a stack from which an example method according to the invention can be implemented, FIG. 3B shows the stack in FIG. 3A on which a seed layer is formed.

FIG. 3C shows the result of a step of forming sets of pads from the stack in FIG. 3A or from that in FIG. 3B.

FIG. 3D shows a phase of the epitaxial growth of crystallites on the top of the pads, this growth phase being incomplete.

FIG. 3E shows the result of the epitaxial growth of crystallites, after coalescence of the crystallites carried by pads of the same set, whereby the crystallites carried by pads of the same set thus form a nitride mesa.

FIG. 3F shows an optional step of producing multi-quantum wells within each nitride mesa.

FIG. 5C shows a first phase which takes place before the two crystallites coalesce.

FIG. 5D shows a second phase which takes place during or after the two crystallites coalesce.

FIG. 18A to 18C show one embodiment wherein the flow sections of the pads are thinned before crystallite growth.

Figure 1A:
FIG. 1A to 1C show steps of a prior art method for producing micro-LEDs.
Figure 1B:
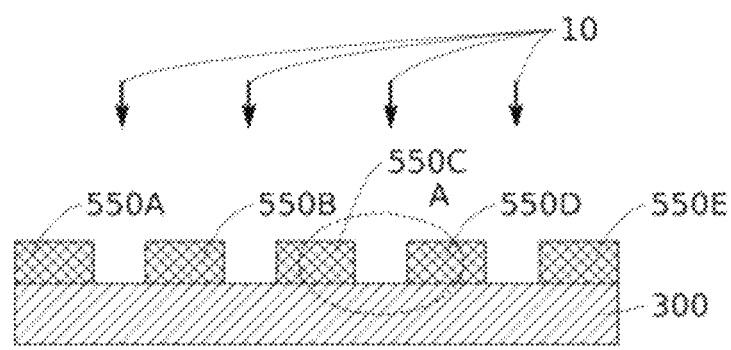
Figure 1C:
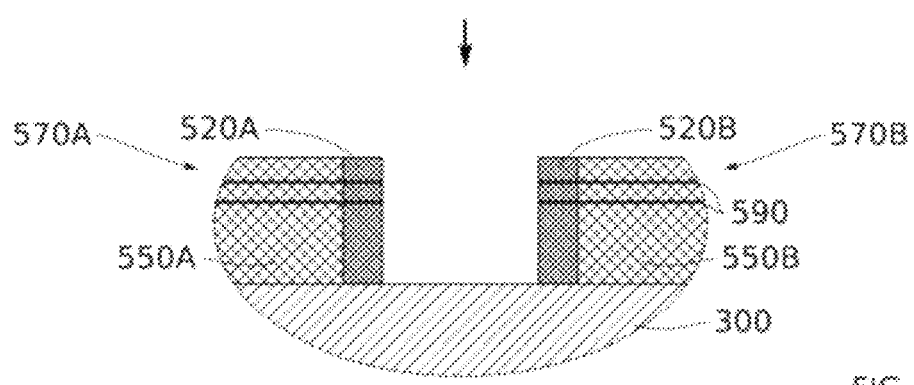

The figures are provided by way of example and are not intended to limit the scope of the invention. They are diagrammatic views intended to ease the understanding of the invention and are thus not necessarily to the scale of practical applications. In particular, the relative thicknesses of the different layers, sections, crystallites and mesas are not representative of reality.

DETAILED DESCRIPTION

Before giving a detailed review of embodiments of the invention, optional features are set out below, which can be used in combination with or in replacement of one another.

According to one example, the distance D between two adjacent pads of the same set is less than the distance W1 between two adjacent pads of two different sets. W1>D and preferably W1≥2×D.

Preferably W1≥k4×D, where k4=1.5, and preferably k4=2. This allows for small pixel sizes and high integration density. Preferably k4=5. W1 can be equal to 1.5 microns.

According to one example, each pad has a cross-section with a maximum dimension $d_{pad}$ comprised between 10 and 500 nm ($10^{-9}$ meters), the maximum dimension $d_{pad}$ being measured in a plane parallel to a plane (xy) wherein a top face of the substrate mainly extends, preferably 20 nm≤ $d_{pad}$≤200 nm and preferably 50 nm≤$d_{pad}$≤100 nm.

According to one example, each mesa has a cross-section with a maximum dimension $d_{mesa}$ comprised between 0.5 and 20 μm ($10^{-6}$ meters), the maximum dimension $d_{mesa}$ being measured in a plane parallel to a plane (xy) wherein a top face of the substrate mainly extends, preferably 0.8 μm≤$d_{mesa}$≤3 μm and preferably 1 μm≤$d_{mesa}$≤2 μm. The maximum dimension $d_{mesa}$ thus corresponds to the maximum dimension of a projection of the mesa in a plane parallel to the xy-plane wherein the top face of the substrate mainly extends.

According to one example, the pads of the same set are distributed on the substrate periodically according to a period $p_{pad}$, where 200 nm≤$p_{pad}$≤3,000 nm and preferably where 200 nm≤$p_{pad}$≤2,000 nm, and preferably 200 nm≤ $p_{pad}$≤500 nm. The period $p_{pad}$ is measured in a plane parallel to a plane (xy) wherein a top face of the substrate mainly extends.

Since W2 is the distance between two adjacent mesas 550A, 550B (see W2 in FIG. 3D), W2 must be non-zero for the two adjacent mesas 550A, 550B not to touch one another. Thus, W2>0.

Theoretically, and if there was no lateral regrowth on the edges of the mesas, for these two adjacent mesas 550A, 550B not to touch one another (non-zero W2), W1 would have to be strictly greater than $2(p_{pad}-d_{pad})/2$, i.e. $p_{pad}-d_{pad}$.

According to one example, W1≥k5×W2, where
W1 is the distance between two adjacent pads belonging to two separate sets,
W2 is the distance between two adjacent mesas, W2 being>0.
where k5=1.2, preferably k5=1.5, preferably k5=2.

Alternatively, the pads of the same set are distributed on the substrate in a non-periodic manner. Optionally, but advantageously, the mesas are distributed on the substrate in a periodic manner.

According to one example, the flow layer is made of a viscous material. It has a viscoplastic transition. Preferably, this material is selected from:
a silicon oxide $Si_xO_y$, where x and y are integers, and preferably the flow layer is made of $SiO_2$,
a glass,
a borosilicate glass,
a borophosphosilicate glass (BPSG).

Optionally, epitaxial growth is carried out at a temperature $T_{epitaxy}$, such that:

$$T_{epitaxy} \geq k1 \times T_{glass\ transition}, \text{ where } k1 \geq 0.8.$$

According to one example, k1=1, and preferably k1=1.5. According to an example embodiment, k1=0.87 or k1=0.9. According to a particularly advantageous example, k1=0.92. Thus, in the case where the flow sections are formed of $SiO_2$, $T_{epitaxy} \geq 1,104°$ C., since $T_{glass\ transition}$ for $SiO_2$ is equal to 1,200° C. According to an even more preferred example embodiment, k1=0.95. According to an even more preferred example embodiment, k1=1, and preferably k1=1.5.

According to one example, $T_{epitaxy} \leq k2 \times T_{min\ melting}$, $T_{min\ melting}$ being the lowest melting temperature among the melting temperatures of the sections forming the pad, where k2≤0.9 and preferably k2≤0.8. According to an example embodiment, k2=0.9. This prevents diffusion of the species of the material with the lowest melting temperature. Thus, in the case where the pad is formed of $SiO_2$ flow sections and of silicon crystalline sections, $T_{epitaxy} \leq 1,296°$ C. More specifically, $T_{min\ melting}$ is equal to the melting temperature of silicon since the melting temperature of silicon is equal to 1,440° and the melting temperature of $SiO_2$ is equal to 1,970° C. Preferably, k2=0.8.

According to one example, the pads comprise at least one buffer layer overlying the crystalline layer, and made of a different material than the nitride mesas. According to this example, the nitride mesas are made of gallium nitride (GaN) and the buffer layer is made of aluminium nitride (AlN). This prevents the melt back etching phenomenon, generated by the very high reactivity between gallium and silicon.

According to one example, the buffer layer is formed by epitaxial deposition on top of the crystalline layer, before the pad formation step by etching. Thus, the stack comprises, prior to the epitaxial growth step of the nitride mesas, at least said buffer layer. By forming the plurality of pads by etching after the formation of the buffer layer on top of the crystalline layer, deposition of the buffer layer between the pads, typically on the bottom of the flow layer, can be prevented, or deposition of the buffer layer on the walls of the sections formed by the crystalline layer can be prevented, which would have happened if this step of forming the buffer layer had been carried out after etching the stack to form the pads. This prevents the epitaxial growth of the nitride mesas from the flow layer. Of course, this advantage is observed when the growth of the nitride layer intended to form each mesa is carried out by selective epitaxy. More specifically, this growth takes place on the material of the buffer layer, but not on the material of the flow sections. This is the case when the latter are made of $SiO_2$, the buffer layer is made of AlN and the nitride mesa formed by epitaxy, for example by MOVPE (Metal Organic Vapour-Phase Epitaxy), is made of GaN. As a result, the latter is not deposited at the base of the pads.

According to one example, the pads comprise, prior to the step of epitaxially growing the nitride mesas, at least one seed layer, overlying said buffer layer and made of gallium nitride (GaN).

According to one example, the stack comprises, prior to said step of forming the pads by etching, at least one seed layer, overlying said crystalline layer, the seed layer being made of the same material as the nitride mesas. Thus, in one embodiment wherein the nitride mesas are made of GaN, the seed layer is also made of GaN. Advantageously, this seed layer facilitates the resumption of epitaxial growth to form the crystallites. This feature is particularly advantageous when the surface area of the top of the pads is small.

According to one example, each pad has a top face and the epitaxial growth of the crystallites takes place at least in part and preferably only from said top face. Preferably, the buffer layer is disposed directly in contact with the top face of the crystalline section or in contact with the top face of the section formed by the seed layer.

If the top of the pad, i.e. the uncovered top face of the pad, is formed by the crystalline section, then the crystallites are epitaxially grown directly in contact with the crystalline layer. If the top of the pad is formed by the seed layer, then the crystallites are epitaxially grown directly in contact with the seed layer. If the top of the pad is formed by the buffer layer, then the crystallites are epitaxially grown directly in contact with the buffer layer. Preferably, the seed layer is disposed directly in contact with the top face of the crystalline section.

According to one example, at least one of the buffer layer and the seed layer retains a constant thickness during the epitaxial growth step.

According to one example, providing said stack comprises providing an elaborate substrate of the silicon-on-insulator (SOI) type comprising a base substrate successively overlaid by an oxide layer forming said flow layer and a semiconductor layer forming said crystalline layer.

According to one example, the flow section has a height $e_{220}$ that is such that $e_{220} \geq 0.1 \times d_{pad}$, where $d_{pad}$ is the diameter of the pad or more generally the edge-to-edge distance of the pad measured at the flow section and in a direction parallel to a plane (xy) wherein a top face of the substrate mainly extends, preferably $e_{220} \geq 1 \times d_{pad}$. These values procure sufficient deformation to reduce the stresses at the grain boundary.

According to one example, the pads have a height $H_{pad}$, and two adjacent pads are separated by a distance D, such that:

$$H_{pad}/D < 2 \text{ and preferably } H_{pad}/D \leq 1.$$

According to one example, the crystalline layer is silicon-based and preferably the crystalline layer is made of silicon.

The crystalline layer can also have a base made of different materials than Si and which allow for the epitaxy of nitride materials. For example, the crystalline layer can be SiC- or $Al_2O_3$-based. These materials can also be used in the form of SiCOI (SIC-On-Insulator) or SOS (Silicon-On-Sapphire).

According to one example embodiment, the crystalline layer is a mono-crystalline layer.

According to one example embodiment, the flow layer is in direct contact with the substrate. The flow layer is in direct contact with the crystalline layer. According to one example embodiment, the nitride layer forming each mesa made by the coalescence of crystallites is in direct contact with the crystalline layer. According to another embodiment, at least one intermediate layer is provided between the crystalline layer and the nitride layer, which is produced by the coalescence of crystallites and which forms a mesa. This intermediate layer typically forms the buffer layer.

Thus, the flow layer and the crystalline layer are different. The flow layer has a glass transition temperature. It is thus made of a glass transition material and exhibits the behaviour of glass transition materials. Thus, the flow layer is not crystalline. It is made of a viscous or vitreous material, for example an oxide. The flow layer and the crystalline layer are not made of the same material.

According to one example embodiment, the flow layer has a thickness $e_{220}$ of less than 500 nm ($10^{-9}$ metres). It is preferably comprised between 50 nm and 500 nm, and preferably between 100 nm and 150 nm.

According to one example embodiment, the crystalline layer has a thickness comprised between 2 nm ($10^{-9}$ metres) and 10 µm ($10^{-6}$ metres) and preferably between 5 nm and 500 nm and preferably between 10 nm and 50 nm.

According to one example embodiment, crystals are epitaxially grown on all of said pads.

According to one example embodiment, the V/III ratio of the fluxes in the epitaxial deposition reactor (the fluxes being measured for example in sccm) of said material comprising nitride (N) and at least one material selected from gallium (Ga), indium (In) and aluminium (Al) is in the order of 2,000.

According to one example embodiment, the nitride of the mesas is gallium nitride (GaN). According to another embodiment, the nitride of the mesas is gallium nitride (GaN)-based and further comprises aluminium (Al) and/or indium (In).

According to another embodiment, the material forming the nitride (N) of the mesas is any material selected from: gallium nitride (GaN), indium nitride (InN), aluminium nitride (AlN), aluminium gallium nitride (AlGaN), indium gallium nitride (InGaN), aluminium gallium indium nitride (AlGaInN), aluminium indium nitride (AlInN), and aluminium indium gallium nitride (AlInGaN).

According to one example, the step of forming the pads comprises etching the crystalline layer and etching only a portion of the flow layer so as to retain a portion of the flow layer between the pads.

According to one example, the step of forming the pads is carried out such that $d_{crystallite}/d_{pad} \geq k3$, where $k3=3$, $d_{pad}$ being the maximum dimension of the cross-section of the pad measured in a direction parallel to a plane (xy) in which a top face of the substrate mainly extends (the pad or more generally the edge-to-edge distance of the pad, i.e. the maximum dimension of the pad regardless of its cross-sectional shape), $d_{crystallite}$ corresponding to the dimension of the crystallite measured in the same direction as $d_{pad}$ at the time of crystallite coalescence.

Particularly effective results were obtained for $k3=3$. According to one example $100 \geq k3 \geq 3$. Preferably, $50 \geq k3 \geq 3$. Preferably, $5 \geq k3 \geq 3$.

This feature allows the flow sections to deform so that they are particularly effective in absorbing the mechanical stresses that are generated when two adjacent crystallites begin to coalesce. Thus, this feature is effective in reducing the defect density in the nitride mesas ultimately obtained.

Preferably, $P_{pad}/d_{pad} \geq 4$, and preferably $P_{pad}/d_{pad} \geq 5$. According to one example that gives particularly qualitative results, $P_{pad}/d_{pad}=5$.

Preferably, $H/d_{pad} \geq 2$. This ratio allows the stress relaxation mechanism to take place by cracking the pads.

According to one example, after said pads are formed, and before said epitaxial growth of the crystallites, a step of thinning the flow sections is carried out. This thinning step comprises selectively etching the flow sections at least with respect to the crystalline sections. Thus, the cross-section of the flow sections is reduced at the end of this thinning step. However, the remaining cross-section of the flow sections is sufficient to support the crystalline section, as well as any sections formed by the buffer and seed layers, and the crystallites that will be formed by epitaxy. This optional embodiment allows the stresses in the method to be released during the formation of the pads, while at the same time conducing to the flow deformation of the pads during the coalescence of the crystallites.

According to one example, the method comprises a step of forming a barrier layer on the nitride mesas, followed by a step of forming at least one source, drain and gate on the barrier layer. This allows a vertical transistor, preferably of the HEMT type, to be formed from each mesa. The nitride layer, typically made of GaN, of such a transistor can have a large thickness with a low dislocation rate and without causing deformation of the substrate.

Preferably, the barrier layer is made of AlGaN or is AlGaN-based. Preferably, the barrier layer is formed by epitaxy. The transistor can comprise other layers between the nitride mesa and the barrier layer.

The term "micro-LED" refers to an LED having at least one dimension measured in a plane parallel to the main plane in which the substrate supporting the micro-LED extends (i.e., the xy-plane of the orthogonal coordinate system given in the figures) that is micrometric, i.e., strictly less than 1 mm ($10^{-3}$ metres). Within the scope of the invention, micro-LEDs have, projecting in a main extension plane parallel to the main faces of the micro-LEDs, i.e. parallel to a top face of the substrate, maximum dimensions that are of micrometric size in the plane. Preferably, these maximum dimensions are less than a few hundred micrometres. Preferably, these maximum dimensions are less than 500 µm.

In the present invention. "transistors of the HEMT type" (High Electron Mobility Transistors) are understood to mean high electron mobility field-effect transistors, sometimes also referred to as heterostructure field-effect transistors. Such a transistor includes the overlaying of two semiconductor layers with different band gaps that form a quantum well at the interface therebetween. Electrons are confined in this quantum well to form a two-dimensional electron gas. For reasons related to high voltage and temperature resistance, the materials of these transistors are chosen such that they have a wide band gap.

In the description hereinbelow, the terms crystals and crystallites will be considered to be equivalent.

It is specified that, within the scope of the present invention, the terms "on", "overlying", "covers" or "underlying" or the equivalents thereof do not mean "in contact with".

Thus, for example, "the deposition of a first layer on a second layer" does not necessarily mean that the two layers are directly in contact with one another, but rather means that the first layer covers at least partially the second layer while being either directly in contact therewith, or while being separated therefrom by at least one other layer or at least one other element, including air. Similarly, "a pad overlying a first layer" does not mean that the pad is necessarily in contact with this first layer, but rather means that the pad is either in contact with this first layer or in contact with one or more layers disposed between the first layer and the pad.

The steps for forming the different layers and regions are to be understood in a broad sense: they can be carried out in several sub-steps which are not necessarily strictly successive.

In the following description, the thickness or the height is measured in a direction perpendicular to the main faces of the different layers. In the figures, the thickness or the height is measured along the vertical or z-axis of the orthogonal coordinate system shown in FIG. 3A.

Similarly, when an element is indicated as being located in line with another element, this means that these two elements are both located on the same line perpendicular to the main plane of the substrate, i.e. on the same vertically-oriented line (z-axis) in the figures.

A material M-"based" substrate, layer, or device is understood to mean a substrate, a layer, or a device comprising this material M only or comprising this material M and optionally other materials, for example alloying elements, impurities or doping elements.

The terms "substantially", "about", and "in the order of" mean "to within 10%" or, when referring to an angular orientation, "to within 10°". Thus, a direction substantially normal to a plane means a direction having an angle of 90±10° relative to the plane.

One example method for forming a plurality of mesas according to the invention will now be described with reference to FIG. 3A to 3F.

Figure 3A:

As shown in FIG. 3A, a stack is provided comprising at least one substrate 100, successively overlaid by a flow layer 200 and a crystalline layer 300. Thus, the flow layer 200 is disposed between the substrate 100 and the crystalline layer 300.

According to one example embodiment, the substrate 100 is either amorphous or crystalline silicon-based. This procures the mechanical strength of the stack.

The crystalline layer 300 has a bottom face facing the flow layer 200 and a top face designed to serve as a base layer for epitaxially growing the nitride of the mesas 550A, 550B that are to ultimately be obtained. For example, the layer to ultimately be obtained is a layer of gallium nitride GaN. According to one example embodiment, the crystalline layer 300 is monocrystalline silicon-based. Alternatively, the crystalline layer 300 can be SiC- or $Al_2O_3$-based.

Preferably, the flow layer 200 is made of a viscous material. The flow layer 200 has a glass transition temperature. It thus has a glass transition point and exhibits the behaviour of glass transition materials. Like all materials with a glass transition temperature, the flow layer 200 deforms under the effect of a temperature rise without breaking and without returning to its original position after the temperature falls. Conversely, the crystalline layer 300 evidently does not have a glass transition point. The crystalline layer deforms, then dislocates and can break. Thus, the flow layer 200 and the crystalline layer 300 are different. The flow layer 200 is not crystalline.

The flow layer 200 is made of an amorphous material such as an oxide, preferably a silicon oxide $SiO_xO_y$, such as $SiO2$. The role of this layer will be explained in the description hereinbelow.

Advantageously, but in a non-limiting manner, this stack comprising the substrate 100, the flow layer 200 and the crystalline layer 300 constitutes a substrate of the semiconductor-on-insulator type, preferably of the silicon-on-insulator (SOI) type. In such a case, the flow layer 200 is formed by the buried oxide (BOX) layer of the SOI substrate.

According to one advantageous example embodiment shown in FIG. 3A, a buffer layer 400 is deposited by epitaxy on the top face of the crystalline layer 300. When the mesas 550A, 550B to ultimately be obtained are formed of GaN and the crystalline layer 300 is a silicon-based layer, this buffer layer 400 is typically made of aluminium nitride (AlN). This prevents the so-called "melt-back etching" phenomenon, generated by the very high reactivity between silicon and gallium at usual epitaxial temperatures (1,000/1,100° C.) and which leads to very strong degradation of the GaN mesa 550A, 550B.

Typically, the thickness of the AlN layer is comprised between 10 and 200 nanometres ($10^{-9}$ metres).

Figure 3B:
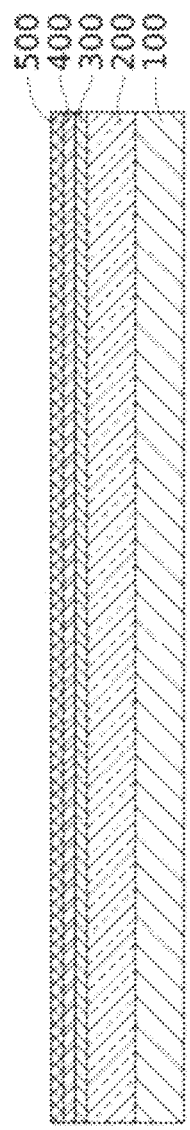

As shown in FIG. 3B, a seed layer 500 can also be epitaxially deposited on the top face of the buffer layer 400. The function of this seed layer 500 is to facilitate the resumption of the growth of the crystallites 510 in the following steps. In such a case, at least part of the epitaxial growth of the crystallites 510A1-510B4 occurs from a top face of the seed layer 500, the crystallites being shown in FIG. 3D. This seed layer 500 is preferably made of the same material as the mesas 550A, 550B that are to ultimately be obtained. Typically, when the material of the mesas 550A, 550B is gallium nitride GaN, the seed layer 500 is also made of GaN. This seed layer 500 typically has a thickness comprised between 50 and 200 nanometres.

For the sake of brevity and clarity, only four pads 1000A1-1000A4 are shown in the figures to support a mesa 550A. It goes without saying that a mesa 550A can be formed on a larger number of pads. As will be described hereinbelow, the number of pads and the period thereof will be adapted to the desired size of the micro-LED.

It should be noted that the layers 400 and 500 are merely optional. Thus, according to embodiments not shown in FIG. 3A-3F, only the buffer layer 400 or only the seed layer 500, can be provided, or neither of these two layers 400 and 500 can be provided.

Figure 3C:
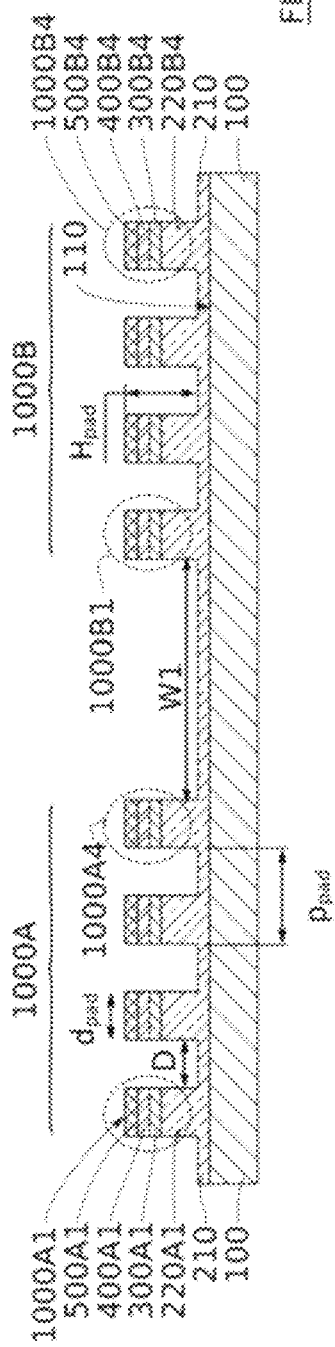

As shown in FIG. 3C, pads 1000A1-1000B4 are then formed from the stack. These pads are obtained by etching the stack as far as into the flow layer 200, with at least part of the etch extending into the flow layer 200.

In order to form the pads by etching, the many etching techniques known to a person skilled in the art can be used. In particular, conventional lithography techniques can be used, such as photolithography techniques comprising the formation of a mask, for example made of resin, then the transfer of the patterns of the mask into the stack. E-beam lithography or nano-imprinting techniques can also be used.

These pads 1000A1-1000B4 have small dimensions and can be described as nano-pads. Typically, the maximum dimension of the cross-section of the pads, measured in a plane parallel to the xy-plane of the orthogonal xyz-coordinate system or to the plane of the top face 101 of the substrate 100, is comprised between a few tens and a few hundreds of nanometres. More specifically, $d_{pad}$ is comprised between 10 and 500 nanometres and preferably between 20 and 150 nm and preferably between 50 and 100 nm, for example in the order of 50 nm or of 100 nm. This maximum cross-sectional dimension of the pads is given the reference $d_{pad}$ in FIG. 3C. If the pads have circular cross-sections, this maximum dimension $d_{pad}$ corresponds to the diameter of the pads. If the pads have hexagonal cross-sections, this maximum dimension $d_{pad}$ corresponds to the diagonal or to the diameter of the circle passing through the corners of the hexagon. If these pads have rectangular or square cross-sections, this maximum dimension $d_{pad}$ corresponds to the largest diagonal.

The pads 1000A1-1000B4 are not all evenly distributed on the surface of the substrate 100. The pads 1000A1-1000B4 form sets 1000A, 1000B of pads, each set comprising a plurality of pads. The pads 1000A1-1000A4 forming the same set 1000A form an array of pads spaced apart from the array of pads 1000B1-1000B4 forming another set 1000B.

Thus, the adjacent pads 1000A1-1000A4 of the same set 1000A are separated by a distance D. The adjacent pads 1000A4-1000B1 belonging to two separate sets 1000A, 1000B are separated by a distance W1. The distances D and W1 are measured in planes parallel to the xy-plane and are shown in FIG. 3C. As will be explained hereinbelow, the pads 1000A1-1000A4 of the same set 1000A are intended to support a single mesa 550A which will be spaced apart from another mesa 550B supported by another set 1000E of pads 1000B1-1000B4.

It should be noted that D can vary for the same mesa. Thus, the pads 1000A1-1000A4 of the same mesa 550A can be distributed in a non-periodic manner. The distribution thereof can thus be adapted to promote the growth of the mesa. For example, if the arrangement of the pads 1000A1-1000A4 of a mesa 550A is not periodic, a distance D that varies for these pads 1000A1-1000A4 by plus or minus 20 or by plus or minus 10%, for example plus or minus 10 nm, around a mean value, can be present. According to one example, D can have the following values for the same mesa: 100 nm, 90 nm, 85 nm, 107 nm.

The mesas 550A, 550B formed on sets of pads 1000A, 1000B not distributed in a periodic manner can be disposed periodically on the substrate. This facilitates the production of a microdisplay.

According to one example embodiment, the sections of the pads 1000A1-1000B4, formed in the flow layer 200, have a height e220 and, within the same set, two adjacent pads 1000A1, 1000A2 are spaced apart by a distance D, such that:

e220/D<1, and preferably e220/D<1.5. Preferably e220/D<2.

According to one example embodiment, the pads have a height $H_{pad}$, and two adjacent pads are separated by a distance D, such that:

$H_{pad}$/D<2, and preferably $H_{pad}$/D<1.5. Preferably $H_{pad}$/D≤1.

$H_{pad}$ and e220 are measured in the z-direction. D is measured parallel to the xy-plane.

As shown in FIG. 3C, the pads are etched through the entire seed layer 500, the entire buffer layer 400 (where these layers are present), and the entire crystalline layer 300. Preferably, only a portion 220 of the flow layer 200 is etched. The advantage of this embodiment is that it prevents the nitride of the mesas 550A, 550B from growing on the flow sections 220 during epitaxy. This epitaxial selectivity is particularly true when the nitride mesa 550A, 550B being epitaxially grown is made of GaN and the flow sections are made of SiO2. Conversely, if, with these same materials, the flow layer 200 is etched through the entire thickness thereof, then, during epitaxy, the nitride of the mesas 550A, 550B grows from the top face of the substrate 100, usually made of silicon. This situation is clearly not ideal.

Furthermore, keeping a non-etched portion 210 of the flow layer 200 is seen to facilitate the flow of the section 220, in particular when the crystallites are misoriented by twisting, i.e. in the main extension planes of the mesas 550A, 550B that are to be obtained. These main extension planes of the mesas 550A, 550B are parallel to the xy-plane of the xyz-coordinate system.

Preferably, the etched thickness e220 thus forming the height of the flow section 220, is equal to half the thickness of the flow layer 200. This procures a very good reorientation of the crystallites during the formation of grain boundaries.

FIG. 3D shows the formation of crystallites 510A1-510B4 by epitaxial growth from the seed layer 500 (or from the top face of the crystalline layer 300 when the layers 400 and 500 are absent).

As shown in this FIG. 3D, the pads 1000A1-1000B4 each support a crystallite 510A1-510B4 carried by a stack of sections 400A1-400B4, 300A1-300B4, 220A1-220B4. The sections extend in the main extension direction of the pad, i.e. vertically (z) in FIG. 3A to 3F.

The sections form circular cylinders if the cross-section of the pads is mainly circular. If the cross-section of the pads 1000A1-1000B4 is polygonal, for example hexagonal, then the sections form cylinders with a hexagonal cross-section. Preferably, the sections are solid. The cross-section of the pads is measured parallel to the xy-plane, i.e. parallel to the planes in which the flow layer 220 and the crystalline layer 300 mainly extend.

Whichever embodiment is chosen, i.e. with or without a seed layer 400 and with or without a buffer layer 500, the epitaxial growth of the crystallites 510A1-510B4 takes place at least partly or solely from the top face 1001 of the pad 1000A1-1000B4. Thus, this top face 1001 is formed either by the crystalline section 300A1-300B4, or by the section formed by the seed layer 400A1-400B4, or by the section formed by the buffer layer. In particular, this allows crystallites 510A1-510B4 of significant thickness to be quickly obtained.

It should be noted that the top faces of the buffer layer 400 and of the seed layer 500, i.e. the faces facing the layer of the mesas 550A, 550E to be grown, have Gallium (Ga)-type polarities, and not nitrogen (N), which considerably facilitates the production of high-quality epitaxially-grown nitride mesas 550A, 550B.

The growth of the crystallites 510A1-510B4 is continued and extends laterally, in particular in planes parallel to the xy-plane. The crystallites 510A1-510B4 from the same set 1000A of pads 1000A1-1000A4 grow until they coalesce and form a block or mesa 550A, 550B as shown in FIG. 3E.

In other words, and as shown in the figures, each mesa 550A, 550B extends between a plurality of pads 1000A1-1000A4. Each mesa 550A, 550B forms a continuous layer.

This growth of the crystallites 510A1-510B4 does not extend downwards. Furthermore, this growth is selective in that it does not take place on the flow layer 200 typically made of an oxide. In this sense, the growth of the crystallites 510A1-510B4 takes place according to the principle of pendeo-epitaxy.

It should be noted that the pads 1000A1-1000B4 are particularly advantageously etched after the epitaxial formation of the buffer layer 400 and of the seed layer 500 (where these layers are present). More specifically, if one of these layers 400, 500 was deposited after etching, it would form, at least in part, between the pads 1000A1-1000B4 on the top face of the flow layer 200. In the case where the epitaxially-grown nitride is GaN and the flow layer 200 is made of SiO2, then, at the epitaxial deposition temperature, the epitaxial growth of the nitride mesas 550A, 550B would not be selective but would instead also take place between the pads 1000A1-1000B4, which is of course not ideal.

In a particularly advantageous manner, the temperature $T_{epitaxy}$ at which the epitaxy is carried out is greater than or in the order of the glass transition temperature $T_{glass\ transition}$ of the flow layer 200. Thus, during epitaxy, the flow sections 220A1-220A4 are heated to a temperature that allows them to deform.

As a result, if the crystallites 510A11-510A12 carried by two adjacent pads 1000A1-1000A2 are misoriented with respect to one another, upon the coalescence of these two crystallites, the boundary 560 formed at the interface therebetween, usually referred to as a grain boundary or coalescence boundary, will form without dislocation to correct these misorientations. The deformation of the flow sections 220 thus allows these misorientations to be corrected and mesas 550A, 550B with no or very few dislocations at the coalescence boundaries to be obtained. This phenomenon will be described in detail hereinbelow with reference to FIG. 5A to 5D.

Thus, at the end of step 3E, a plurality of mesas 550A, 550B is obtained, each mesa 550A being supported by the pads 1000A1-1000A4 of a same set 1000A of pads. Two adjacent mesas 550A, 550B are separated by a distance W2, where W2 is the shortest distance measured between these two mesas. W2 is measured in the xy-plane.

W2 depends on W1, the duration and the speed of epitaxial growth. W2 is non-zero. W2<W1.

The maximum dimension of a mesa measured parallel to the xy-plane is given the reference $d_{mesa}$. Thus, $d_{mesa}$ corresponds to the maximum dimension of a projection of the mesa in a plane parallel to the xy-plane. Preferably 0.8 µm≤$d_{mesa}$≤3 µm and preferably 1 µm≤$d_{mesa}$≤2 µm. $d_{mesa}$ depends on the speed and duration of the epitaxial growth as well as on the number, the dimension and the pitch $p_{pad}$ of the pads in the same set.

The method for producing the mesas 550A, 550B can be stopped at the end of FIG. 3E. Alternatively, this method can be continued to form a micro-LED from each of the mesas 550A, 550B.

FIG. 3F shows a non-limiting embodiment wherein quantum wells 590 are produced within each mesa 550A, 550B. This embodiment advantageously allows a micro-LED of a size corresponding to the initial size of the mesa to be directly produced. In order to create quantum wells 590 within each mesa 550A, 550B, a person skilled in the art can implement solutions known in the prior art. Thus, once the crystallites 510 have coalesced, the same growth conditions are adopted for the wells as for conventional two-dimensional growth.

The smallest possible dimension for micro-LEDs depends on the ultimate resolution of the chosen structuring methods: for example, for arrays made by nano-imprinting, pad sizes of 50 nm and periods $p_{pad}$ of 150 to 200 nm are achieved. This means that mesa dimensions $d_{mesa}$ of 1 to 2 µm are obtained. This is thus in the range of the pixel sizes required for high-resolution µ-displays.

Figure 4A:
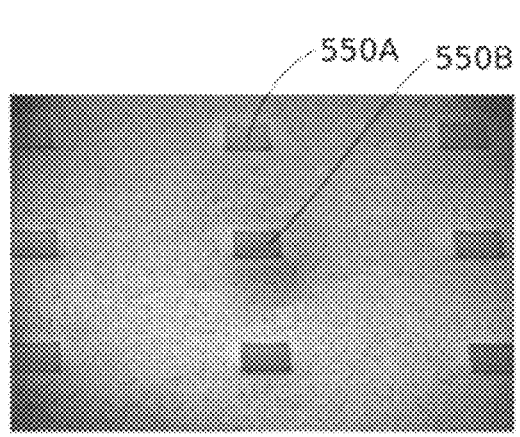
FIG. 4A is a photograph obtained by scanning electron microscopy (SEM) showing a substrate supporting a plurality of mesas obtained using the method according to the invention.

FIG. 4A is a photograph obtained by scanning electron microscopy (SEM) showing a substrate supporting a plurality of mesas 550A, 550B obtained using the method described hereinabove.

Figure 4B:
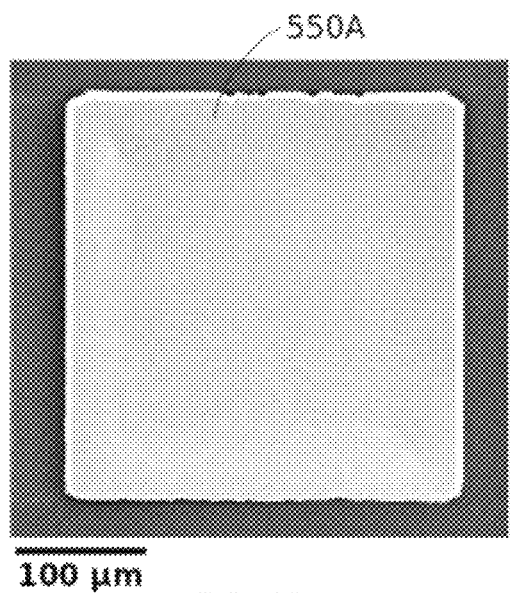
FIG. 4B to 4D are photographs obtained by scanning electron microscopy (SEM), at a higher magnification to that in FIG. 4, and showing mesas of different sizes obtained using the method according to the invention.

FIG. 4B is a photograph obtained by scanning electron microscopy (SEM), at a higher magnification to that in FIG. 4, and showing a mesa 550A, The top face of the mesa in this FIG. 4B is square in shape. Each side is 300 µm long. The pads have a cross-section that can be likened to a square with a side length of 200 nm.

Figure 4C:
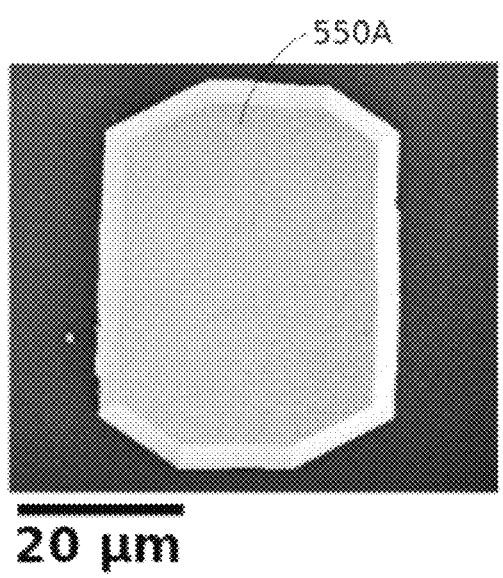

FIG. 4C is a photograph of another mesa 550A. The top face of this mesa has a hexagonal or substantially rectangular shape when projected in the xy-plane. Considering this shape to be rectangular, the lengths of two adjacent sides are 40 and 50 µm. The mesa thus has an area of 40 µm×50 µm.

Figure 4D:
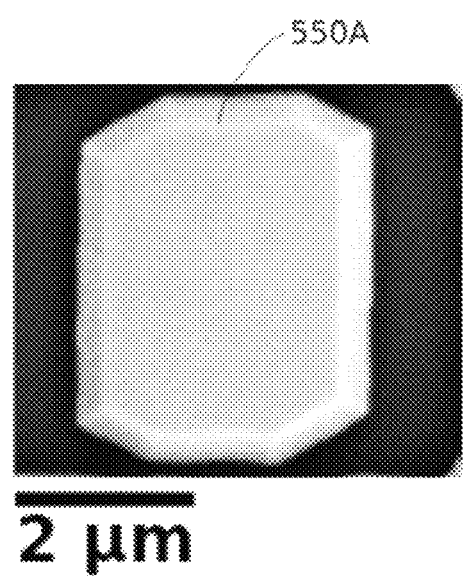

FIG. 4D is a photograph of another mesa 550A. The top face of this mesa has a hexagonal or substantially rectangular shape when projected in the xy-plane. Considering this shape to be rectangular, the lengths of two adjacent sides are 3 and 4 µm. The mesa thus has an area of 3 µm×4 µm.

These examples relate to GaN mesas obtained from an array of pads etched into a GaN-on-SOI stack.

These FIG. 4A to 4D show that mesas 550A measuring a few tens to a few hundred µm can be produced by implementing the method described hereinabove. The dislocation density in these GaN mesas is in the order of 1 to 2 $10^E8/cm^2$. The radiative efficiency of the quantum wells is very good. A display comprising a plurality of LEDs formed from these mesas has a high resolution and brightness.

Modelling and Explanation of the Principle of Coalescence with Few or No Dislocations within the Mesas As shown above with reference to FIG. 3E, if the crystallites 510A11-510A12 carried by two adjacent pads 1000A1-1000A2 are misoriented with respect to one another, upon the coalescence of these two crystallites, the boundary 560 formed at the interface therebetween will form without dislocation by correcting these misorientations. The deformation of the flow sections 220 as proposed by the present invention thus makes it possible to correct these misorientations. This principle is explained in the paragraphs below.

Figure 5A:
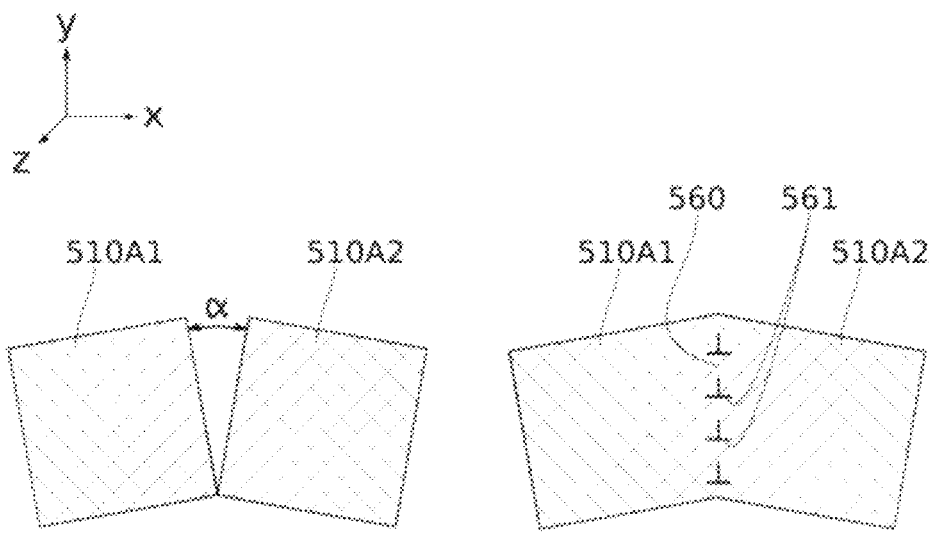
FIG. 5A diagrammatically shows, from an overhead view, the coalescence of two crystallites within the scope of a conventional pendeo-epitaxy method.
Figure 5B:
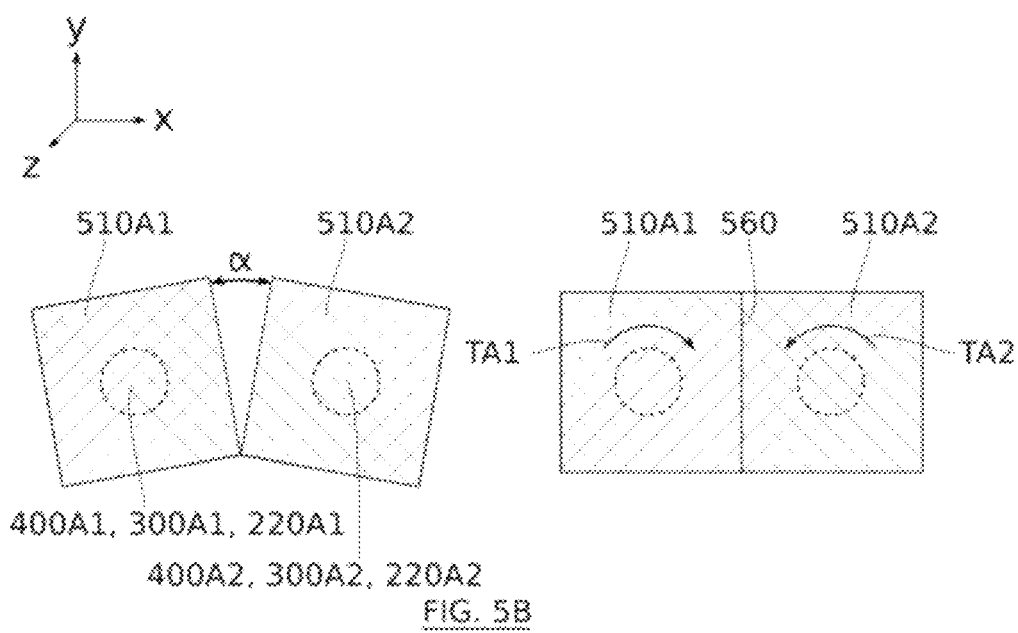
FIG. 5B diagrammatically shows, from an overhead view, the coalescence of two crystallites within the scope of an example method according to the present invention.

As shown in FIGS. 5A and 5B, the misorientation of the two adjacent crystallites 510A1-510A12 can result from an in-plane misalignment (i.e. about axes contained in the plane of FIG. 3A-3F), referred to as a twist.

FIG. 5A, which shows an overhead view of the crystallites 510A1-510A2, illustrates this type of misalignment with the presence of an angle α between the crystallites. FIG. 5A diagrammatically shows that, with conventional methods for epitaxially forming nitride layers, the boundary 560 that forms during coalescence gives rise to dislocations 561 to correct the misalignments.

There are several reasons for the presence of dislocations with the known methods for producing a nitride layer.

A first reason is that the epitaxial growth of the nitride layer is carried out on hetero-substrates, i.e. on substrates whose material and thus lattice parameters are different from those of the nitride layer to be epitaxially grown.

A second reason for the presence of dislocations is that epitaxial growth is columnar. This is mainly related to the low diffusivity of the species on the surface of the hetero-substrate during growth, which results in the formation of small grains. During coalescence, these grains join together, forming dislocations at the interface therebetween, i.e. at the coalescence boundary, which then pass through the entire epitaxially-grown structure.

For reasons concerning cost and availability and with dimensions that are compatible with industrial restrictions, substrates of the same nature as the layers to be epitaxially grown (homo-substrates) cannot be used.

Industrial solutions are thus based on the use of hetero-substrates. However, when hetero-substrates are used, many dislocations are generated in the epitaxial layers and these defects propagate into the active regions of the device.

One solution to reduce the dislocation density is to use so-called "epitaxial lateral overgrowth" (ELOG) methods. The principle of this method is based on the fact that, at a certain stage of epitaxial growth, a mask with openings is deposited. The seeds grow in the openings and then over the mask by lateral regrowth. Lateral regrowth results in the bending of the dislocations from the seeds, thus preventing the vertical propagation thereof. This type of method thus eliminates a large number of dislocations by bending, however dislocations are also created during coalescence. More specifically, when two crystallites from two adjacent openings join above the mask, a coalescence boundary is formed and the dislocation can reach the surface.

In practice, while it is clear that dislocations under the mask are effectively blocked, dislocations that manage to propagate through the openings in the mask propagate into the epitaxial layer and can reach the surface.

It goes without saying that the density of penetrating dislocations resulting from coalescence is greatly reduced compared to that of "natural" coalescence, since the "grains" are of larger dimensions (typically in the order of the period of the openings in the mask). However, these dislocations are non-uniformly distributed, which can cause problems during the manufacture of devices, since it results from the formation of bands of non-luminescent material vertical to these zones.

Another solution consists in the epitaxial growth of the material on pre-existing pads of this material: this method is referred to as the pendeo-epitaxial method, which dispenses with the need for regrowth on the mask. On the other hand, known pendeo-epitaxy solutions do not eliminate or significantly reduce the appearance of defects generated by the coalescence of adjacent seeds.

FIG. 5B very diagrammatically shows the formation of the coalescence boundary 560 using the method described hereinabove. FIG. 5B shows the twisted deformation TA1, TA2 (about the z-axis) of the flow sections allowing a coalescence boundary 560 to be formed without dislocation. In such a case, the correction of this deformation by the flow sections 220a-220b leads to a twisting of the flow sections 220A1-220A2 about the main axis thereof. Each section rotates in an opposite direction as shown in the right-hand view in FIG. 5B.

Figure 5C:
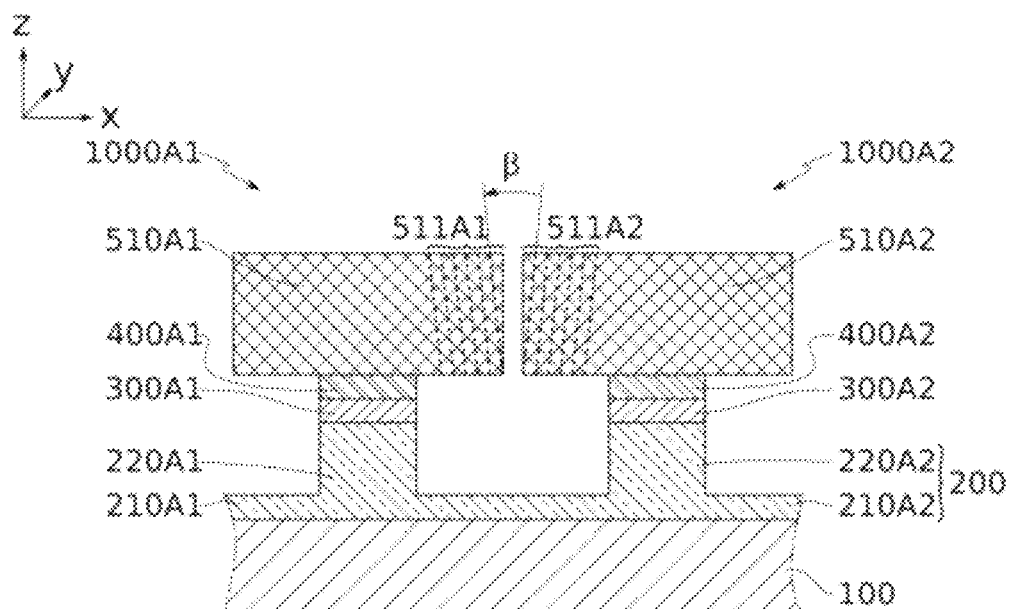
FIGS. 5C and 5D diagrammatically show, from a side view, the coalescence process for two crystallites within the scope of an example method according to the present invention.
Figure 5D:
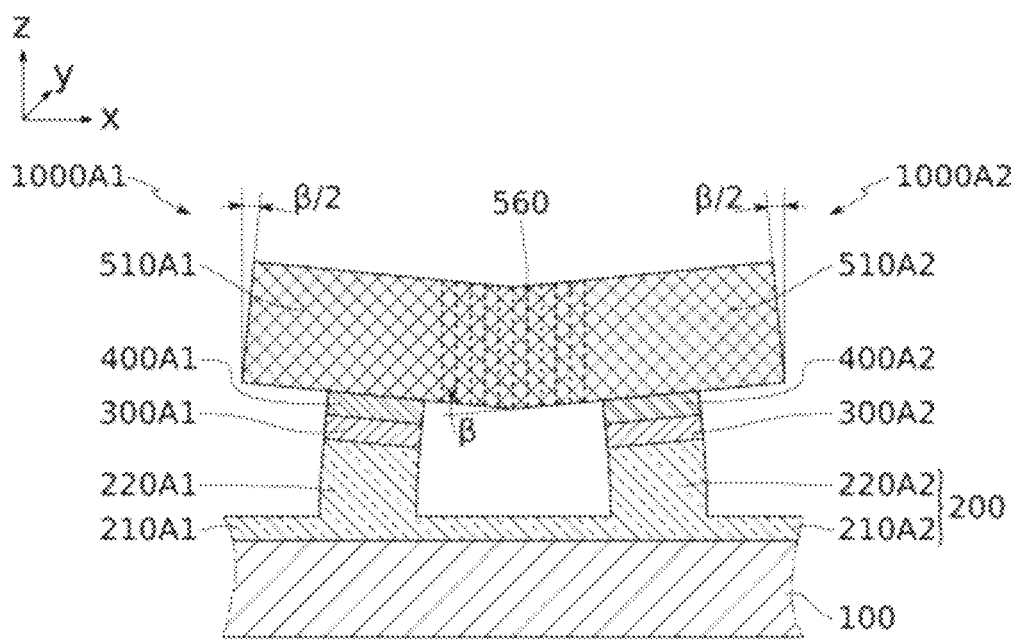

As shown in FIGS. 5C and 5D, the misorientation of the two adjacent crystallites 510A1, 510A2 can further result from an out-of-plane misalignment (i.e. about axes parallel to the y-axis or to the x-axis of the xyz-coordinate system), referred to as a tilt. In such a case, the correction of this deformation by the flow sections 220A1-220A2 leads to a tilting of the pads.

FIG. 5C shows the angular misorientation between the crystalline planes of the crystallites 510A1 and 510A2 before coalescence, by the angle β. FIG. 5D very diagrammatically shows the deformation of the flow section 220 allowing a coalescence boundary 560 to be formed without dislocation. It has been assumed in this diagram that the misorientation is equally distributed between the two crystallites 510A1 and 510A2, i.e. by β/2. The diagram is also applicable in the case where the crystalline misorientations have different angles in the two adjacent crystallites and whose sum is equal to β.

FIG. 5A to 5D are not intended to be a realistic visual representation of the deformation of the flow sections. These figures are intended to provide a diagrammatic view for easy understanding of the principle of the coalescence of the crystallites without dislocation at the boundaries 560. The following paragraphs are intended to provide further explanations and clarifications regarding this principle.

The paragraphs hereinbelow aim to explain in more detail the phenomena that allow an epitaxially grown layer or mesa 550A, 550B to be obtained with no or very few dislocations.

When two grains or crystallites are rigidly bonded to the substrate on which they have been deposited and are slightly misoriented relative to one another, the formation energy of their coalescence boundary is high (it can be calculated quite easily since it is, to a first approximation, an array of interfacial dislocations. Reference can be made in this respect to the following publication: J. P. Hirth and J. Lathe "Theory of dislocations", John Wiley and sons (1982)).

However, if the crystallites 510A1-510A4 rest on pads 1000A1-1000A4, as is the case with pendeo-epitaxy, and these pads 1000A1-1000A4 can deform, either by twisting or tilting, the misorientation of the crystallites (for example of GaI1) relative to one another is "transmitted" to the pads carrying these crystallites. In the case of a simple twist, as shown in FIG. 5B, the phenomenon can be modelled by saying that the attractive forces that cause the crystallites to rotate to join and form an "internal" surface result in a twisting torque at the nano-pads 1000A1-1000A4. This twisting torque will be greater the smaller the ratio between the size of the pads 1000A1-1000A4 and the size of the crystallites. If the deformation of the pads 1000A1-1000A4 is easy, then the coalescence boundary 560 simply becomes an internal surface for which the "perfect" atomic bonds will be formed. In terms of energy, this will only be possible if the energy released during coalescence by the formation of an "internal surface" is greater than the energy required for the pads 1000A1-1000A4 themselves to deform to absorb the initial misorientations between the adjacent crystallites 510A1-510A2. The fact that the underlying pad is a SiO2 pedestal is beneficial since SiO2 flows at the growth temperature. SiO2 is a material that is effectively well suited for this method, but this does not rule out the use of other materials, such as glasses that can flow at equivalent or lower temperatures, such as borosilicate glasses or borophosphosilicate glasses (BPSG), which are also used in the manufacture of Sal.

In the case of hypothetically cubic GaN crystallites with a side length of 500 nm carried by pads with a circular cross-section measuring 100 nm in diameter, the energy released during coalescence can be expressed as the difference between the internal bonding energy and the surface energies of the two surfaces that will be brought into contact. The surface energy values are in the order of 0.1 to 0.2 eV/Angström$^2$ (reference can be made in this respect to the following publication: C. E. Dreyer, A. Janotti, and C. G. Van de Waffle "Absolute surface energies of polar and nonpolar planes of GaN", PHYSICAL REVIEW B 89, 081305(R) 2014). The bonding energies are in the order of 11 eV (Ga—N bond).

As a first approximation, starting from a hexagonal surface (type 0001), a value of 36 eV per unit cell (three Ga—N bonds per unit cell) is obtained, i.e., for the hexagonal unit cell considered (surface area of 26 A$^2$), a bonding energy related to the surface area of 1.35 eV/Angstrom$^2$ is obtained. This approach has been simplified by considering bringing into contact c-type (0001) surfaces, but the corrections related to the crystal orientation of these surfaces (number of bonds per unit cell and surface energies) are of the second order and only slightly modify this numerical evaluation.

Figure 2A:
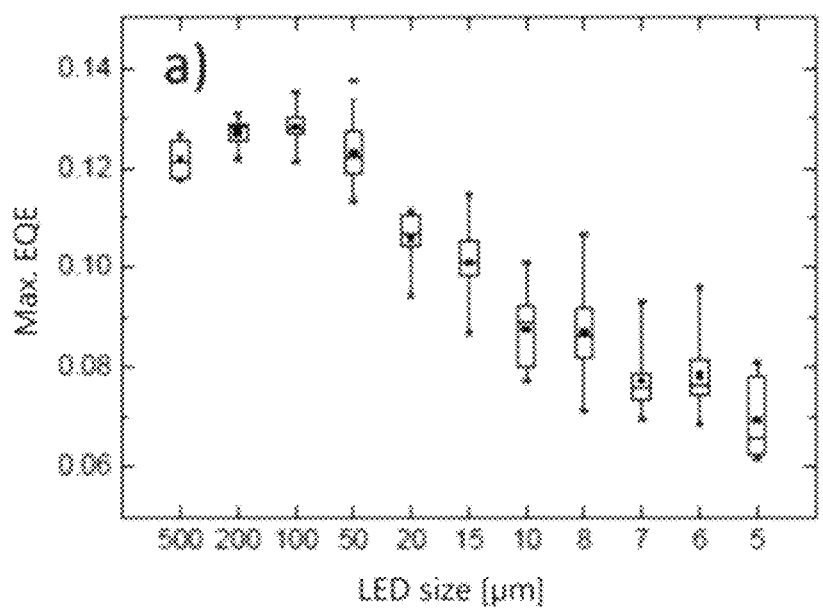
FIG. 2A to 2C show the drawbacks of the micro-LED solutions obtained using the prior art solutions.
Figure 2B:
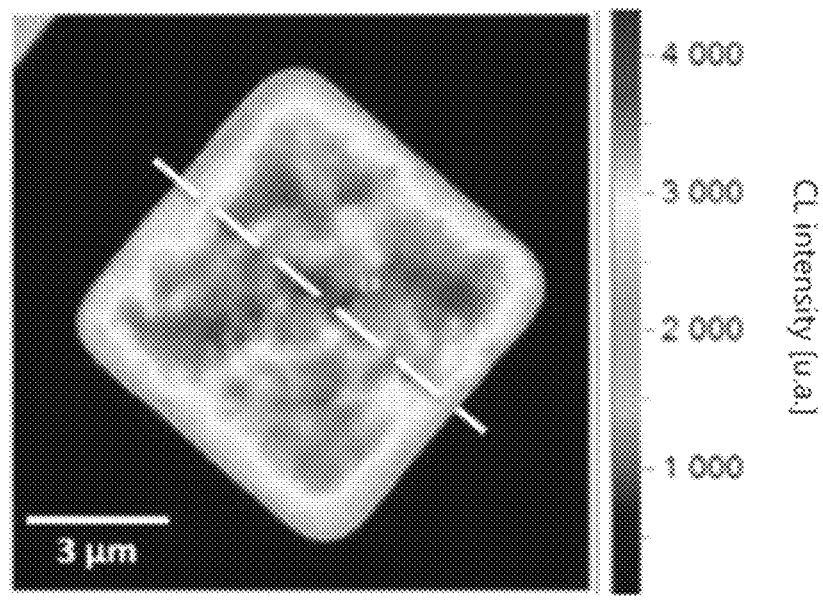
Figure 2C:
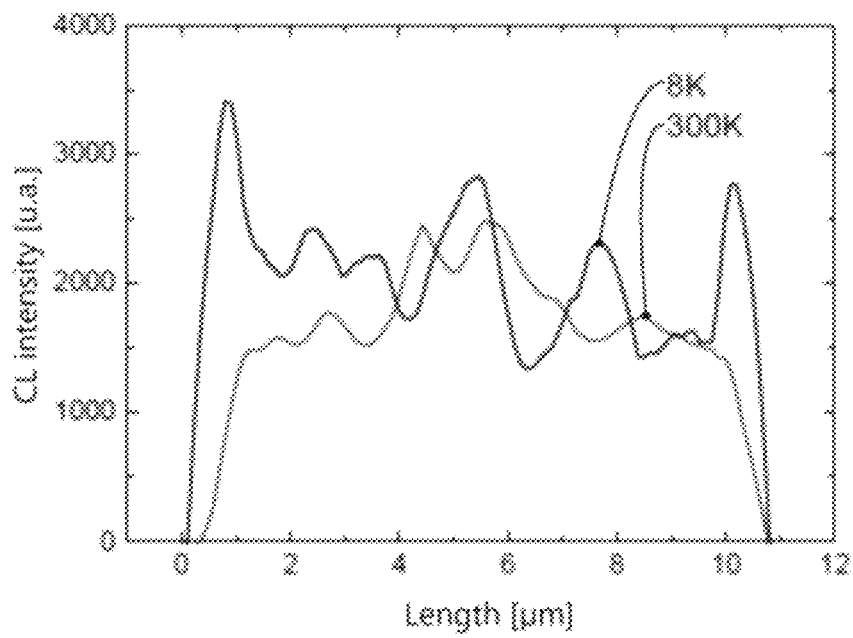
Figure 2D:
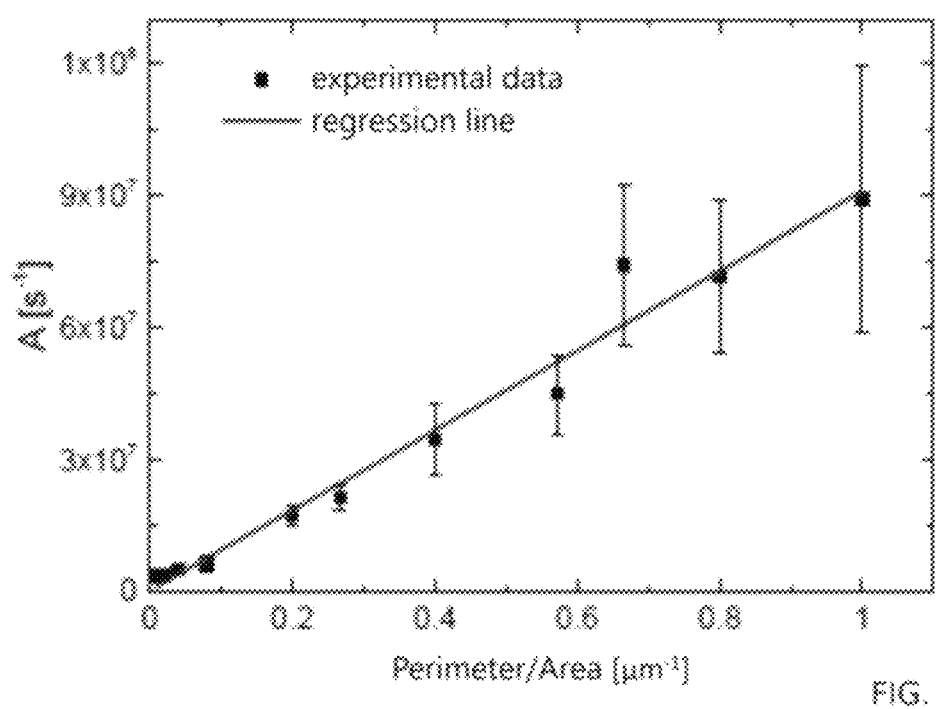
FIG. 2D is a graph showing the variation of the Shockley-Read-Hall (SRH) recombination parameter A as a function of the perimeter-to-area ratio of a micro-LED.

An energy "release" (final state–initial state) is thus observed at the contact by the formation of covalent bonds of 1.35−0.3=1.05, i.e. about 1 eV per Angström$^2$. This is obviously independent of the misonentation between the crystallites 510A1, 510A2 to be brought into contact. If crystallites with a cubic shape are considered (to simplify the estimation as in the diagrams in FIG. 2b) with a side length of 500 nm, an energy release of 25 10$^E$6×1.6 10$^E$-19, is observed i.e. in the order of 4 10$^E$-12 Joules. This must be compared to the energy required to deform the SiO2 pads 1000A1-1000A4 under the crystallites as described in detail hereinbelow.

At the epitaxial temperature of GaN (about 1,100° C.), silicon oxide exhibits viscoplastic behaviour with a viscosity that depends on both the temperature and the mechanical stress to which the material is subjected.

As the temperature increases, the viscosity of the SiO2 decreases, like any material with a glass transition point. Above a certain stress value, the viscosity of the SiO2 also decreases as the mechanical stress increases. In other words, unlike a conventional fluid wherein the plastic strain rate is proportional to the shear stress (stress-independent viscosity), beyond a threshold value, referred to as the failure stress, the strain rate of SiO2 increases exponentially as the stress increases. In practice, at 1,100° C., the failure stress of SiO2 is in the order of 500 MPa: at this temperature, the viscosity of SiO2 is thus independent of stress up to stresses of 500 MPa. Beyond this value, the viscosity drops by several orders of magnitude and very fast plastic strain then leaves a residual stress close to the failure stress. This residual stress then decreases much more slowly by conventional flow (several minutes to several hours).

Prior to alignment, the GaN crystallites 510A1-510A4 show a misorientation relative to one another, on average equal to 1 to 6°. Before neighbouring crystallites come together to form covalent atomic bonds, the inter-atomic forces acting between the crystallites are Van der Waals forces which are attractive at a very short range. This results in a rotation torque being applied at the point of contact to align them. After a very small rotation by a fraction of a degree, the failure stress of 500 MPa is reached in the flow section 220A1-220B4 under the pads 1000A1-1000A4. The flow thus becomes almost instantaneous in the oxide and the rotation torque required for rotation is constant during the end of the alignment phase.

Using the geometry shown in FIG. 5B, i.e. a cubic crystallite 510 with a side length of 500 nm centred on a smaller pad with a circular cross-section and a side length of 100 nm, complete coalescence of the crystallites 510A1-510A4 is achieved in typically a few hundred seconds. If 1 s is considered to be the characteristic time for bringing the crystallites 510 into contact, a numerical model shows that, in order to rotate the pad by 2° in about one second, a mechanical work in the order of 0.5$^E$-20 to 1$^E$-20 Joules is required, taking into account the failure of the oxide at a high temperature. The energy released by bringing the two surfaces into contact, which is in the order of 10$^E$-11 to 10$^E$-13 Joules, is thus much greater than the mechanical deformation energy of the underlying pads 1000A1-1000A4. This energy is also several orders of magnitude lower than that which would have been required to align pads built on bulk silicon or to align pads formed by a material without a glass transition phase around the epitaxial growth temperature of the crystallites 510A1-510A4.

The considerations in the above paragraphs show that in order to achieve crystallite coalescence without dislocation, the following parameters can be adjusted:

The "mechanical failure" properties of the material forming the high-temperature flow section at relatively low stresses of 500 MPa.

The sufficiently small size of the support pads 1000A1-1000A4 compared to the distance D between the pads of the same set 1000A, allows a stress to be created in the flow section that is, for a given rotation torque, greater than the failure stress.

Moreover, as mentioned hereinabove, care should be taken to ensure that the epitaxial temperature $T_{epitaxy}$ allows the flow section 220 to flow. In practice, $T_{epitaxy} \geq 600°$ C. (in the context of molecular beam epitaxy), $T_{epitaxy} \geq 900°$ C. and preferably $T_{epitaxy} \geq 1,000°$ C. and preferably $T_{epitaxy} \geq 1,100°$ C. These values are particularly effective in reducing defects in the epitaxially-grown layer or mesa when the flow layer is made of S102. In practice, $T_{epitaxy} \leq 1,500°$ C.

In order to facilitate the formation of coalescence boundaries 560 without dislocation, the following conditions should be applied:

$T_{epitaxy} \geq k1 \times T_{glass\ transition}$, where k1=0.8, preferably k1=1 and preferably k1=1.5.

According to one example embodiment, $T_{epitaxy} \leq k2 \times T_{min\ melting}$, $T_{min\ melting}$ being the lowest melting temperature among the melting temperatures of the sections forming the pad. This mainly concerns the crystalline section and the flow section. According to an example embodiment, k2=0.9. This prevents diffusion of the species of the material with the lowest melting temperature.

Thus, in the case where the pad is formed of SiO2 flow sections and of silicon crystalline sections, $T_{epitaxy} \leq 1,296°$ C. More specifically, $T_{min\ melting}$ is equal to the melting temperature of silicon since the melting temperature of silicon is equal to 1,440° and the melting temperature of SiO2 is equal to 1,970° C.

According to one example embodiment, the height $e_{220}$ of the flow section is such that $e220 \geq 0.1\ d_{pad}$. Preferably, $e220 \geq 1\ d_{pad}$. These values procure sufficient deformation to reduce the stresses at the grain boundary.

The pads 1000A1-1000A4 have a height $H_{pad}$, and two adjacent pads 1000A1-1000A2 are separated by a distance D, such that: $H_{pad}/D < 2$ and preferably $H_{pad}/D \leq 1$.

Advantageously, the step of forming the pads 1000A1-1000A4 is carried out such that $d_{crystallite}/d_{pad} \geq k3$, where $d_{pad}$ is the maximum dimension of the cross-section of the pad 1000A1-1000A4 measured in a direction parallel to the plane in which the top face 110 of the substrate 100 extends. Thus, $d_{pad}$ corresponds to the maximum dimension of a projection of the pad in the xy-plane. $d_{crystallite}$ corresponds to the dimension of the crystallite measured in the same direction as $d_{pad}$ at the time of coalescence of the crystallites 510A1-510B4. The dimension $d_{crystallite}$ is referenced in FIG. 3E.

According to one example $100 \geq k3 \geq 1.1$. Preferably, $50 \geq k3 \geq 1.5$. Preferably, $5 \geq k3 \geq 2$.

According to one example $k3 \geq 3$, preferably $100 \geq k3 \geq 3$. Preferably, $50 \geq k3 \div 3$. Preferably, $5 \geq k3 \geq 3$.

This feature allows the flow sections to deform so that they are particularly effective in absorbing the mechanical stresses that are generated when two adjacent crystallites begin to coalesce. Thus, this feature is effective in reducing the defect density in the nitride mesa 550A, 550B ultimately obtained.

Figure 18A:
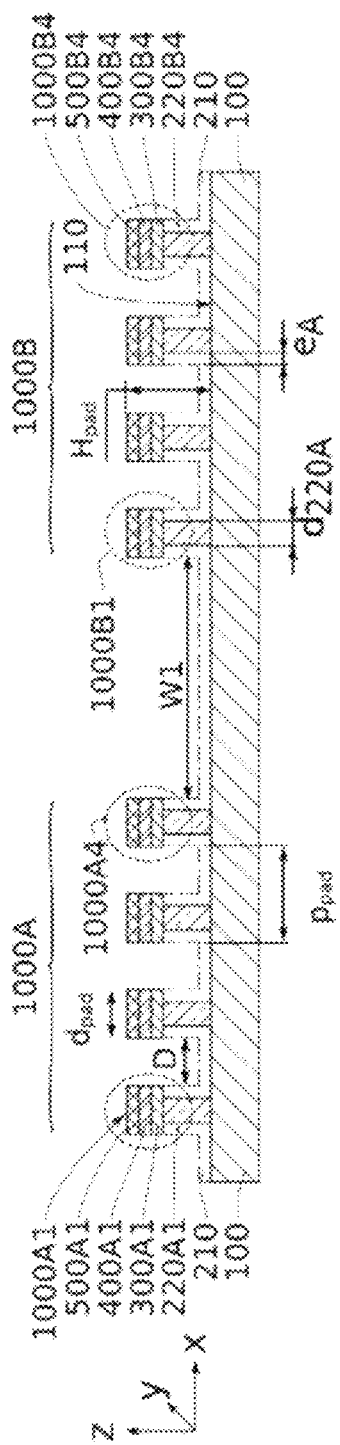
FIG. 18A to 18C diagrammatically show alternative steps to steps 3D to 3F.
Figure 18B:
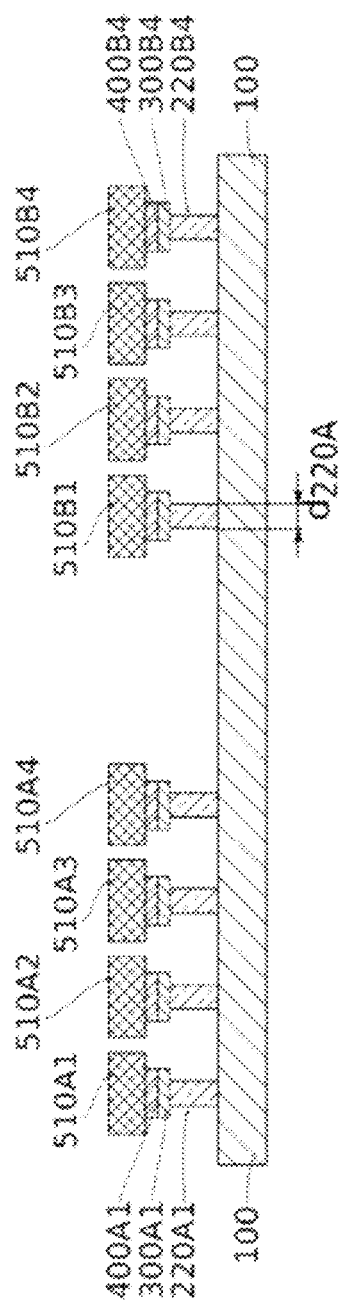
Figure 18C:
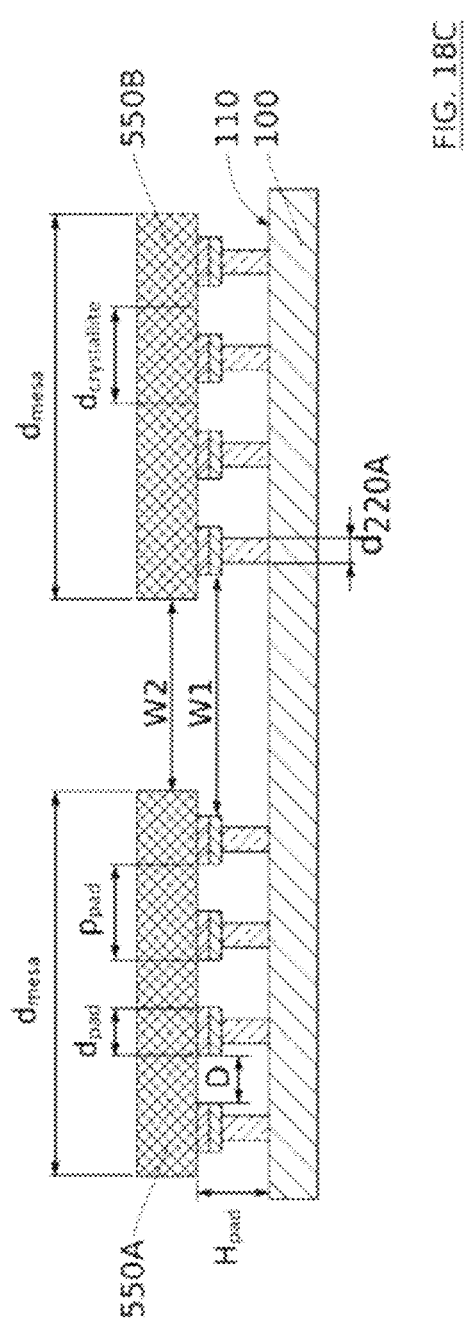

Embodiment in FIG. 18A to 18C

An alternative embodiment will now be described with reference to FIG. 18A to 18C. The steps prior to that shown in FIG. 18A can be identical to the steps shown in FIG. 3A to 3C. Thus, all of the features, steps and technical effects mentioned with reference to these FIG. 3A to 3C are fully applicable to this alternative embodiment.

At the end of the step shown in FIG. 3C, a step of thinning the flow sections 220 is carried out. This step leads to the reduction of the cross-section of the flow sections 220.

Before thinning, the cross-section of the flow sections 220 corresponds to $d_{pad}$, as shown in FIGS. 3C and 18A. After thinning, the cross-section of the flow sections 220 corresponds to $d_{220A}$, as shown in FIG. 18A. The thinned thickness is given the reference $e_A$, as shown in FIG. 18A.

To achieve this thinning, an etch is provided, selectively etching the material of the flow section 220 relative to the material of the crystalline section 300, as well as to the sections formed respectively by the buffer layer 400 and the seed layer 500 when the latter are present. For example, wet etching with a hydrofluoric acid (HF) solution can be implemented. This etching is particularly effective and selective when the flow layer 200 is made of an oxide and the crystalline layer 300 is silicon based.

In the example shown in FIG. 18A, the dotted lines correspond to the contours of the flow layer 200 before etching. In the non-limiting example shown in FIG. 18A, the portion 210 of the flow layer 200 is entirely removed. The substrate 100 is thus exposed. It should be noted that part of the portion 210 is nonetheless preferably retained. Thus, preferably, part of the portion 210 covers the substrate 100. This promotes the deformation of the flow sections 220 during flow.

Step 18B corresponds to the beginning of the epitaxial growth of the crystallites on the pads 1000. This step 18B corresponds to step 3D.

Step 18C corresponds to the coalescence of the crystallites on the pads 1000, until a mesa 550A, 550B is formed on each set 1000A, 1000B of pads. This step 18C corresponds to step 3E.

Thus, all of the features, steps and technical effects mentioned with reference to FIGS. 3D and 3E are fully applicable to this alternative embodiment shown in FIG. 18A to 18C.

In the non-limiting case where LEDs are to be produced, step 18C can be continued by applying the features and steps described with reference to FIG. 3F.

This embodiment, which provides for thinning the flow portion, has several advantages.

In particular, it allows for the production of pads with flow sections of a reduced cross-section prior to the epitaxial growth of the crystallites. This facilitates the deformation of the pads during flow caused by the temperature applied during epitaxial growth. This embodiment further reduces the stresses during coalescence of the crystallites and thus reduces the risk of defects and dislocations appearing.

This embodiment thus allows pads 1000 to be formed, having:
- a crystalline section, or even a section formed by the buffer layer 400 and the seed layer 500, if present, with relatively large dimensions (these dimensions are measured in an xy-plane, parallel to the main faces of the substrate 100). This reduces the stresses on the method when producing the pads 1000. This allows for dimensions that are larger than the dimensions $d_{pad}$ described hereinabove.
- a flow section 220 with a smaller cross-section which favours the deformation and correct orientation of the crystallites during flow. A dimension $d_{220A}$ can be provided for the cross-section of the flow section 220, which dimension corresponds to the numerical values mentioned hereinabove for $d_{pad}$.

Thus, this method reduces the stresses on the method while improving the quality of the resulting nitride mesas 550A, 550B.

For example:
- at the crystalline section $d_{pad} \geq 100$ nm and preferably $d_{pad} \geq 200$ nm and even more preferably $d_{pad} \geq 500$ nm and preferably $d_{pad} \geq 1,000$ nm.
- at the flow section 220, 20 nm $\leq d_{220A} \leq$ 200 nm and preferably 50 nm $\leq d_{220A} \leq$ 100 nm.

Example Embodiments

Several example embodiments of a mesa will now be described with reference to FIGS. 6 to 10.

Figure 6:
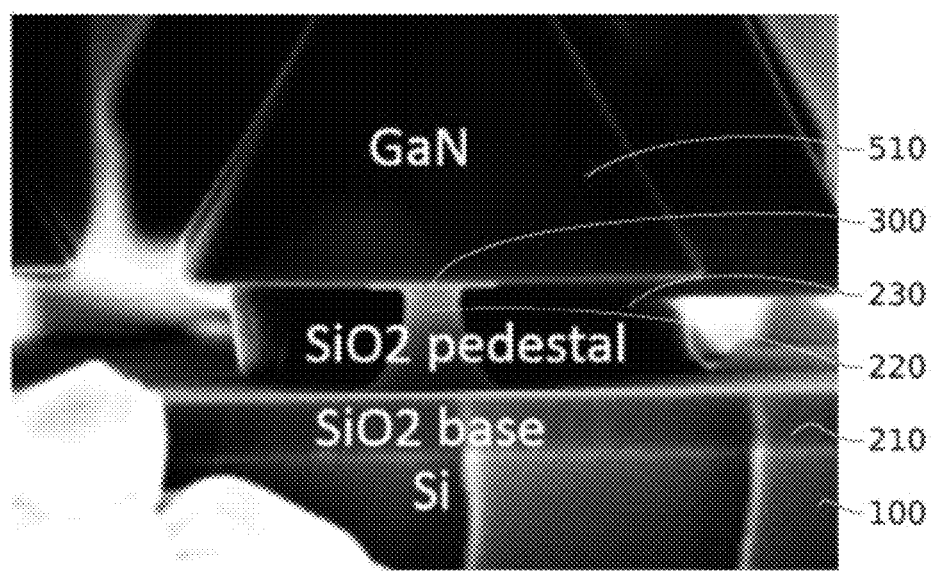
FIG. 6 is a photograph obtained by SEM showing a pad overlaid by a crystallite, obtained by implementing an example method according to the present invention.

FIG. 6 is a photograph taken with a scanning electron microscope (SEM). It shows a stack successively comprising the substrate 100, the portion 210 of the non-etched flow layer, the flow section 220, the crystalline layer 300 and a crystallite 510, in this case made of GaN. This crystallite 510 is pyramidal in shape due to the lower growth rate of the semi-polar planes that form the facets of the pyramid. In this example, the pad has a diameter of 100 nm.

Empty spaces 230 can be seen on either side of the flow section 220.

In order to ensure coalescence of the pyramidal crystallites and obtain two-dimensional growth, the following steps can advantageously be carried out. In a first step, pyramids are produced on each of the nano-pads using given growth conditions until the pyramids adjoin one another. In a second step, these growth conditions are modified to induce lateral growth. This two-step growth procedure is described, for example, in the following publication: Shields et Al. 2011, Nanopendeo coalescence overgrowth of GaN on etched nanorod array Phys. Status Solidi C 8, No. 7-8, 2334-2336 (2011).

Figure 7A:
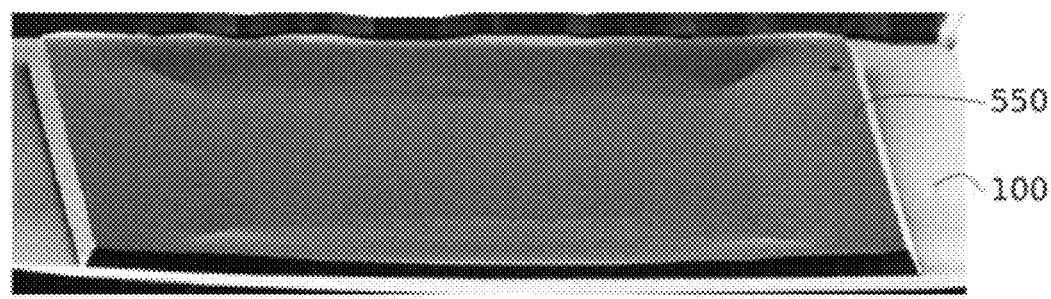
FIGS. 7A and 7B, which are photographs obtained by SEM, show a nitride mesa obtained by epitaxy after implementing the method according to the present invention.
Figure 7B:
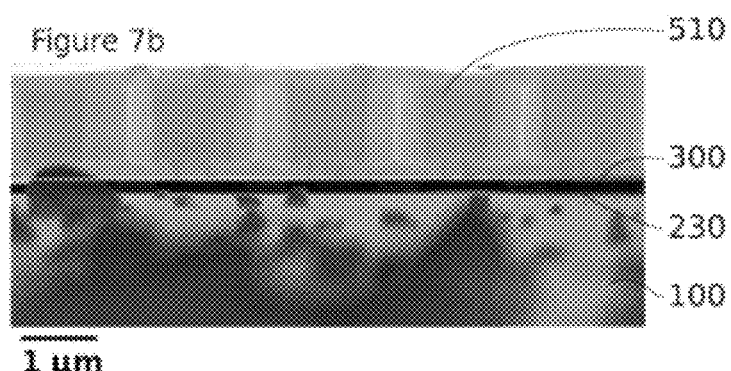

FIGS. 7A and 7B show examples of a mesa 550 formed by a nitride layer obtained by this method for a 197×300 pad array. In this example, the pad size is 200 nm and the pitch thereof is 1 µm. This pad dimension allows the number of dislocations appearing on the crystallite of a pad to be reduced very significantly. Moreover, this pad size optimises deformation and torque transmission during coalescence.

In a particularly advantageous manner, it is clear that the nitride layer forming the mesa 550 has separated from the underlying substrate 100, The delamination of the mesa 550 to ultimately be obtained is thus particularly easy. This automatic delamination can be complete or partial. It will be described in more detail hereinbelow.

Self-supporting GaN mesas can thus be produced, measuring in this example 300×300 µm in size.

Figure 8A:
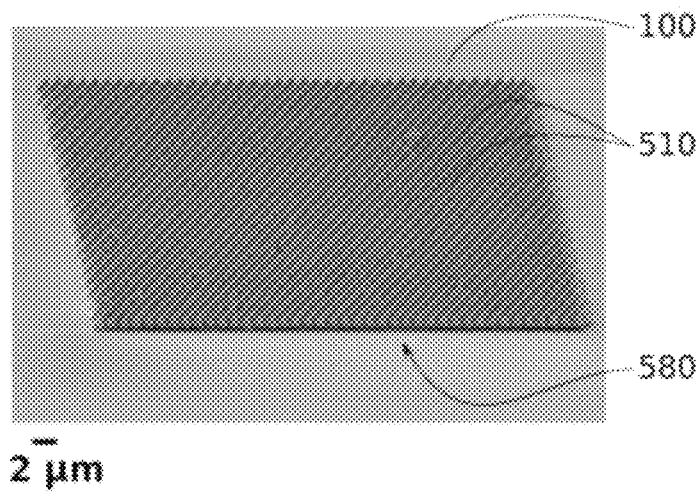
FIG. 8A to 8C are photographs obtained by SEM showing the formation of crystallites within the scope of the method according to the present invention.
Figure 8B:
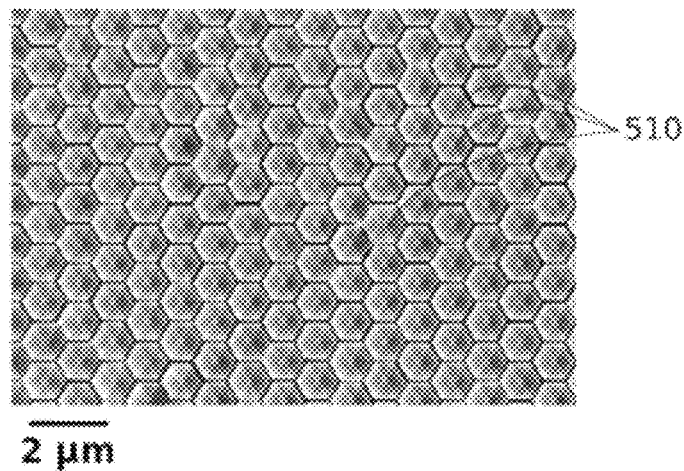
Figure 8C:
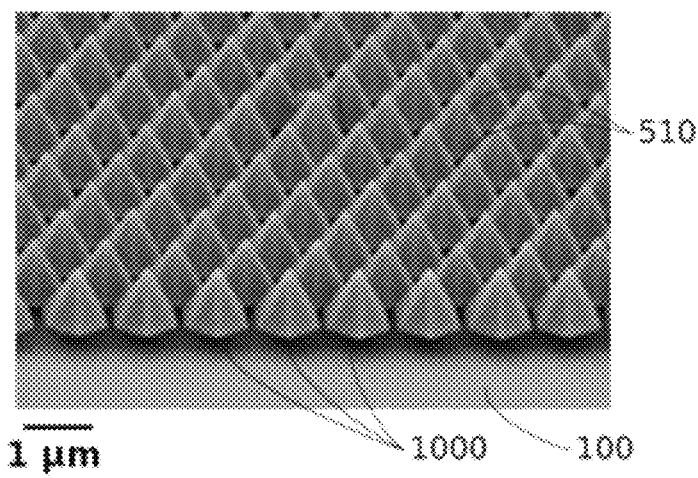
Figure 9:
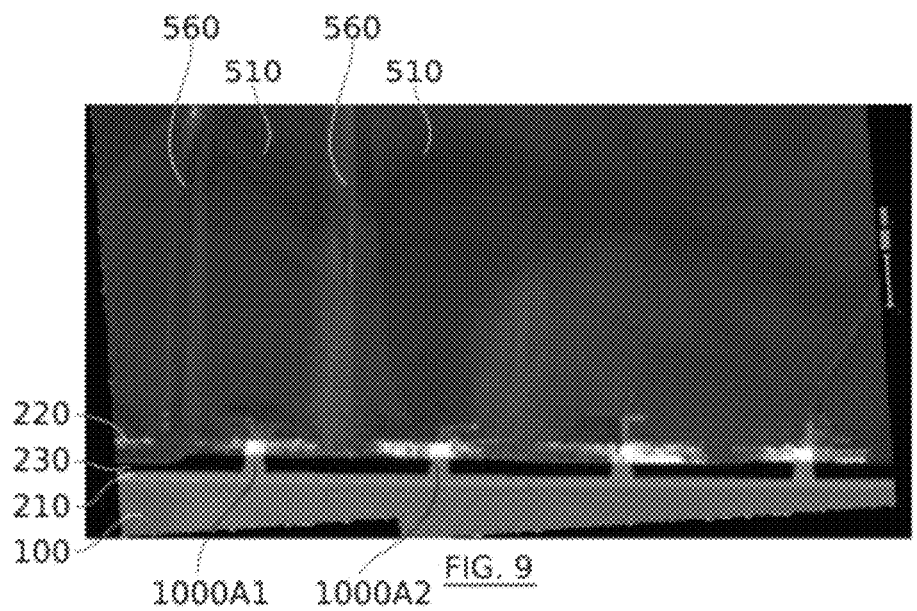
FIG. 9 is a photograph obtained by transmission electron microscopy (TEM) showing a sectional view of a mesa formed by coalescence.

FIG. 8A to 8C are photographs showing, at different magnification levels and viewing angles, an array 580 of pyramid-shaped GaN crystallites 510 obtained after growth on the pads. FIG. 8A is a photograph showing a perspective view of the entire array 580. This array 580 is square and has a surface area of 40×40 µm². FIG. 8B is a photograph showing an overhead view of part of the array 580. FIG. 8C is a photograph showing a perspective view of part of the array 580, clearly showing the crystallites 510 supported by the pads 1000 formed on the substrate 100. As is clear from FIG. 8C, the crystallites 510 form pyramids with a hexagonal cross-section. The pads were produced by e-beam lithography from a stack comprising the following layers:
flow layer 200: SiO2
crystalline layer 300: Si buffer layer 400: AlN seed layer 500: GaN In the example shown in FIG. 8A to 8C, the pads can, for example, be 200 nm in diameter and spaced 1 μm apart.
Characterizations of the Coalescence Defects FIG. 9 is a transmission electron microscopy (TEM) photograph of a cross-section of coalesced GaN crystals 510. This figure firstly shows that most of the dislocations 560 from the re-growth are aligned in the growth plane at the start of the growth.

Figure 11A:
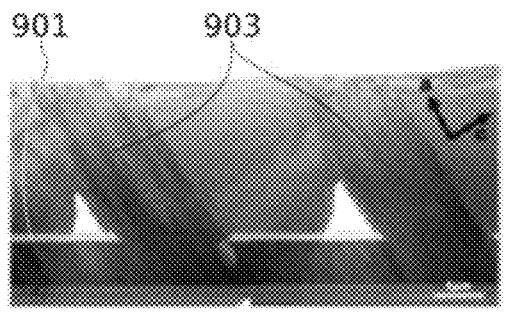
FIGS. 11A and 11B are a photograph obtained by scanning electron microscopy (SEM) and a diagram showing the result of a known method wherein the defects in the nucleation layers pass through the entire final layer.
Figure 11B:
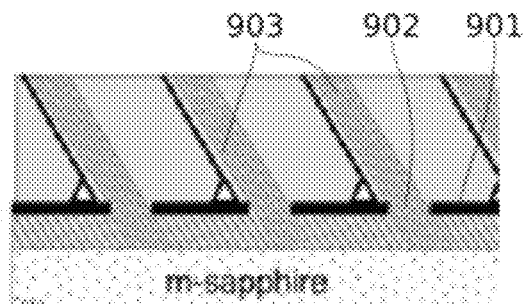

Furthermore, it is clear that the coalescence of the crystallites 510 from adjacent pads occurs with very few coalescence defects at the coalescence boundary 560. This must be compared with conventional methods where coalescence generates penetrating defects. These conventional methods can be based on lateral regrowth as shown in FIGS. 11A and 11B and as described in the publication by E. B Yakimov and A. Y Polyakov, 2015 Ebic investigation of dislocations in ELOG GaN, Phys. Status Solidi. These FIGS. 11A and 11B clearly show that with this method the defects 903 of the nucleation layers pass through the entire final layer through the openings 902 in the mask 901.

These conventional methods can also be based on pendeo-type regrowth from one-dimensional structures as described in the above-mentioned publication by Shields et al. 2011, Nanopendeo coalescence overgrowth of GaN on etched nanorod array Phys. Status Solidi C 8, No. 7-8, 2334-2336 (2011).

FIG. 9 further shows that the pads 1000A1, 1000A2 are split halfway along the height thereof, which allows for easy delamination of the epitaxially-grown mesa 550 on the array 580 of pads 1000A1-1000A2.

This feature is very advantageous in the case of mesas that are ideally to be easily detached after transfer to form micro-LEDs.

Figure 10:
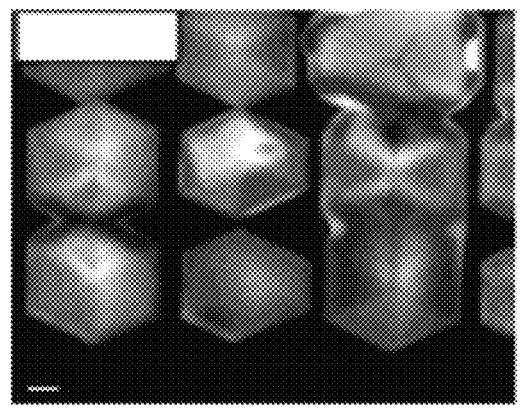
FIG. 10 is a photograph obtained by SEM in "cathodoluminescence" (CL) mode, from an overhead view, of crystallites coalescing using the method according to the present invention.

FIG. 10 confirms the absence of coalescence-caused defects between two crystallites, which are for example pyramid-shaped, using the cathodoluminescence technique. This technique allows a spatial mapping of the emission of photons from the material being considered to be produced. The panchromatic cathodoluminescence image in FIG. 10 shows that, apart from emission variations caused by the extraction of light from the different facets (or edges), there are no non-radiative recombinations at the junction between two crystallites, which indicates the absence of any structural defects in the region of the coalescence boundary.

Method for Producing Micro-LEDs from a Plurality of Mesas

One example method for producing micro-LEDs 570A, 570B will now be described with reference to FIG. 12A to 12O.

A first step consists in providing a device comprising a plurality of nitride mesas 550A, 550B. This device can be identical to that shown in FIG. 3F. It is obtained, for example, by implementing the method described with reference to FIG. 3A to 3F. Thus, each of the nitride mesas 550A, 550B is supported by pads resting on the substrate 100. Preferably, quantum wells 590 are formed in each mesa.

Preferably, a step of protecting the mesas 550A, 550B, in particular the sidewalls 552A, 552B of the mesas 550A, 550B, is carried out. This step comprises, for example, the deposition of a protective layer, also referred to as a passivation layer, to cover the mesas 550A, 550B. This deposition is, for example, of the ALD (atomic layer deposition) type. This allows this protective layer to be formed on all surfaces of the mesas 550A, 550B, in particular on the sidewalls 552A, 552B and on the top face 551A, 551B of the mesas 550A, 550B. This protective layer can also cover the sidewalls of the pads.

For clarity purposes, this protective layer is not shown in FIG. 12A. This protective layer is preferably a dielectric layer. For example, it is made of or has a base formed by one of the following materials: $SiO_2$, $Al_2O_3$, $Si_3N_4$, $HfO_2$. The thickness of this protective layer is preferably comprised between 10 nm and 1 μm.

As shown in FIG. 12A, a dielectric layer 600 is deposited to cover the mesas 550A, 550B. This dielectric layer 600 is deposited by full wafer deposition. It fills the portion of space 630 located between the mesas 550A, 550B. This layer covers the top faces 551A, 551B of the mesas 550A, 550B. This dielectric layer 600 is, for example, made of or has a base formed by one of the following materials: $SiO_2$. SiN.

As shown in FIG. 12B, the dielectric layer 600 is then thinned to provide access to the top faces 551A, 551B of the mesas 550A, 550B. This can be achieved by planarisation chemical-mechanical polishing (CMP). This CMP step is preferably carried out with a stop on the top faces 551A, 551B of the p-doped mesas 550A, 550B.

As shown in FIG. 12C, a next step consists in producing an electrical contact 700 with the top faces 551A, 551B of the p-doped mesas 550A, 550B, This electrical contact is produced in the form of an electrically conducting layer. It is, for example, aluminium- or silver-based. The stack formed by the substrate 100, the pads, the mesas 550A, 550B and the contact 700 is given the reference numeral 2000 in FIG. 12C.

In parallel or following the steps described hereinabove, a complementary device 3000 such as an addressing circuit or an interconnection network is produced. This device 3000 comprises, for example, a substrate 3100 overlaid by a dielectric layer 3200 and conductive zones 3300, each intended to form an electrode and an anode in this example. Such a device 3000 is shown in FIG. 12D. The complementary device is, for example, made of CMOS technology.

As shown in FIGS. 12E and 12F, a step is carried out to prepare for the bonding of the stack 2000 and of the device 3000.

According to a first embodiment, this bonding preparation step comprises depositing a bonding layer 2100 on the electrical contact 700 of the stack 2000 and/or depositing a bonding layer 3400 on the conductive zones 3300. These bonding layers 2100, 3400 are electrically conductive. For example, these bonding layers 2100, 3400 form one of the following material pairs: TiN/Al, TiN/W, TiN/Ti.

According to an alternative embodiment, the bonding of the electrical contact 700 of the stack 2000 to the conductive zones 3300 of the device 3000 is of the direct bonding type. In preparation for this direct bonding, CMP can be carried out on at least one of these two layers 700, 3300.

Figure 12G:
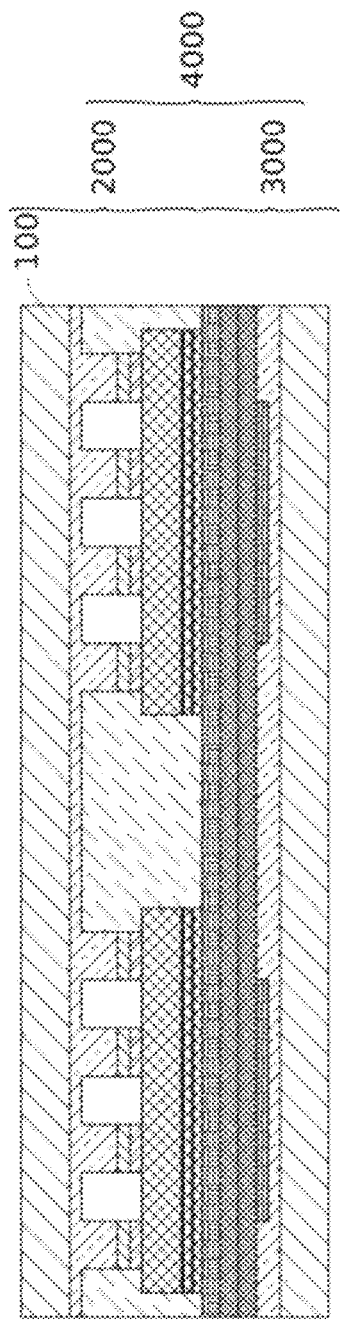
FIG. 12A to 12O show steps in an example method for producing LEDs, typically micro-LEDs, from nitride mesas supported by pads.

FIG. 12G shows the result of the bonding of the stack 2000 on the device 3000. Thus, the conductive zones 3300 are electrically connected to the electrical contact 700. The resulting structure is given the reference numeral 4000.

In the embodiment comprising the deposition of bonding layers 2100, 3400, electrical conduction between the contact 700 and the conductive zones 3300 takes place via these bonding layers 2100, 3400. Preferably, the bonding method comprises thermocompression. In the embodiment comprising direct bonding, the mesas 550A, 550B carrying the electrical contact are disposed directly in contact with the electrodes carried by the device 3000.

Figure 12H:
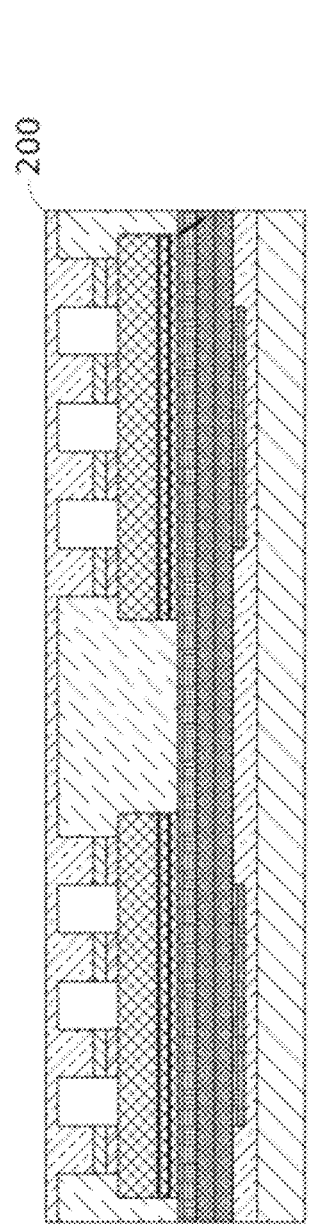

FIG. 12H shows the removal of the support substrate 100. This removal is carried out, for example, by grinding a portion of the thickness of the substrate 100. For example, a thickness of the substrate 100 of about 40 μm can be retained after grinding. The remaining substrate material can then be etched, either by wet or dry etching. As a reminder, this substrate 100 is, for example, made of silicon or is silicon-based. At the end of this step, the flow layer 200 is exposed.

FIG. 12I shows the removal of the flow layer 200. As a reminder, this flow layer is advantageously the buried oxide layer (BOX) in the case whereby the mesas 550A, 550B are formed on a SOI-type substrate. This step of eliminating the flow layer 200 leaves portions 610 of the dielectric layer 600, these portions 610 being located between the mesas 550A, 550B. During this step of removing the flow layer 200, a portion of the thickness of the layer 600 can be consumed. This is particularly the case when the selectivity of the etching of the layers 200 and 600 is low or zero in the case whereby these two layers 200, 600 are made of the same material (typically $SiO_2$).

At the end of this step, a portion of the pads is exposed. In particular, the crystalline portion and the optional buffer portion are present at this stage. In practice, it has been observed that the buffer portion is encapsulated by the GaN mesa.

As shown in FIG. 12J, the residual portions of the pads 1000A1-1000B4 are then eliminated. This step is carried out, for example, by chemical-mechanical polishing. At the end of this step, it is checked that the face 553A, 553B of the mesas 550A, 550B has been made accessible. It is also checked that the stack 4000 has a good planeness.

The next step, shown in FIG. 12K, consists in delimiting the micro-LEDs 570A, 570B. For this purpose, etching is carried out between each mesa 550A, 550B. This etching consists in removing the portion 610 of the dielectric layer 600 through the entire thickness thereof so as to expose the dielectric layer 3200 of the device 3000. This etching thus removes the bonding layers 2100, 3400 and the contact layer 700 between the micro-LEDs 570A, 570B. This etching is stopped on the electric layer 3200 in order to preserve the function thereof. This etching is preceded by a lithography step carried out so as to retain a portion 620 of the dielectric layer 600 on the sidewalls 552A, 552B of the mesas 550A, 550B. Thus, these sidewalls 552A, 552B are completely covered by a dielectric material.

As shown in FIG. 12L, the sidewalls of the openings 630 in the micro-LEDs 570A, 570B are protected by a dielectric film 640. Preferably, this dielectric film is produced by full wafer deposition of a dielectric layer followed by anisotropic etching, the preferred direction whereof is perpendicular to the faces 553A, 553B of the mesas 550A, 550B. This anisotropic etching thus etches the dielectric layer on the horizontal surfaces and retains this dielectric layer 640 on the sidewalls of the openings 630.

As shown in FIG. 12M, only part of the film 640 and of the portions 620 of the dielectric layer 600 on the sidewalls 552A, 552B of the mesas 550A, 550B is removed 650. Thus, a part 552'A, 552'B of the sidewalls 552A, 552B of the mesas 550A, 550B is uncovered, without uncovering the quantum wells 590. The etched thickness of the portions 620, measured along the z-axis, is thus controlled such that the quantum wells 590 remain covered, at the sidewalls 552A, 552B, by the portions 620 of the dielectric layer 600 and by the film 640.

As shown in FIG. 12N, a conductor layer 800 is then deposited by full wafer deposition, filling the space 630 between and covering the mesas 550A, 550B. Preferably, this deposition is carried out by electrolysis (ECD). The conductor layer 800 is preferably a metallic layer such as a copper layer. Optionally, a seed layer can be deposited beforehand to facilitate the bonding of the metal layer.

As shown in FIG. 12O, the conductor layer 800 is then removed to provide access to the faces 553A, 553B of the mesas 550A, 550B.

A dielectric layer can then be deposited on these faces 553A, 553B, then the contacts can be made to connect the micro-LEDs 570A, 570B thus produced.

Example Embodiment of Power Transistors Made Using Mesas

In the description hereinabove, it is stated that the principle of the proposed method allows high-performance LEDs to be produced in an efficient manner. This method further allows other devices to be produced in a particularly advantageous way. This is the case of power devices such as power transistors. The following figures describe certain examples of such devices and the steps for producing same. The examples described hereinbelow more specifically relate to HEMT-type transistors, however are not limited thereto.

Figure 13A:
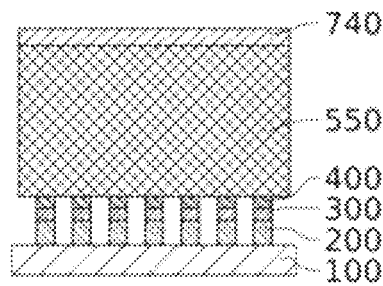
FIG. 13A to 13C diagrammatically show several examples of microelectronic devices, for example vertical transistors of the HEMT type, obtained by implementing the principle of the method described hereinabove.

FIG. 13A shows a structure that is obtained by implementing the method described hereinabove, for example with reference to FIG. 3A to 3E or 3A to 18C. It shows a substrate 100, a flow section 200, a crystalline section 300, an optional section formed by a buffer layer 400 and an optional section formed by a seed layer 500. The optional section formed by the seed layer 500 is not shown in the following figures.

This structure shown in FIG. 13A has a nitride mesa 550, preferably made of GaN or GaN-based. Preferably, this mesa is not intentionally doped and can be classed as a UID, an acronym for unintentionally doped. This structure also has a layer 740 overlying the mesa 550, This layer 740 is nitride-based. It is preferably epitaxially formed from the mesa 550. In the case of a HEMT, if the mesa 550 is made of GaN, the layer 740 can be made of AlGaN.

In the case of a HEMT, the mesa 550 is the seat of the channel and the layer 740 is the barrier layer.

Typically, the nitride mesa 550 has a thickness, measured perpendicular to the top face of the substrate 100, in the order of 10 μm. Typically, the barrier layer 740 has a thickness in the order of 25 nm.

Figure 13B:
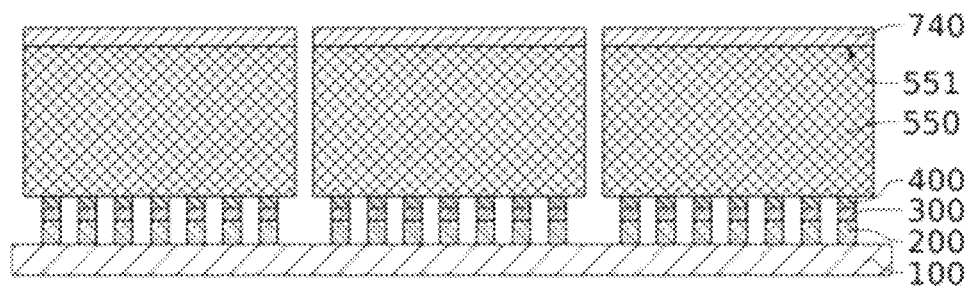

FIG. 13B shows a plurality of structures of this type formed at the surface of the same substrate 100 and resting on pads. It goes without saying that these structures can be formed using any of the methods described hereinabove.

Figure 13C:
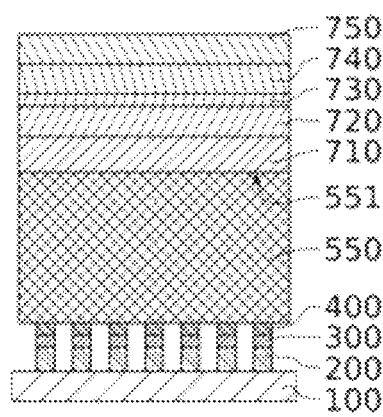

FIG. 13C shows an alternative structure to the structure shown in FIG. 13A. In the structure shown in FIG. 13C, which can also be used to form a HEMT, the mesa 550 rests on the pads and is overlaid by the following successive layers, which are stacked from the top face 551 of the mesa 550:

a back barrier layer 710 (usually referred to as the back barrier). This layer is, for example, made of AlGaN/pGaN. It can have a thickness comprised between 50-100 nm. This layer is optional. This layer improves the confinement of the two-dimensional electron gas.

a layer 720 intended to form the channel for the transistor. This layer is preferably made of GaN or is GaN-based. It has, for example, a thickness comprised between 100 and 300 nanometres.

a spacer layer 730. This layer is preferably made of AlN or is AlN-based. It has, for example, a thickness in the order of 1 nanometre. This layer is optional. This layer improves the confinement and thus increases the mobility of the charge carriers.

the layer 740 intended to form the barrier layer for the transistor. This layer is preferably made of AlGaN or is AlGaN-based. It has, for example, a thickness comprised between 10 and 25 nanometres.

a passivation layer 750. This layer is preferably made of nitride, for example SiN. It has, for example, a thickness comprised between 2 and 50 nanometres. This layer is optional. It prevents trapping of charges at the surface.

The nitride mesa 550 can have a thickness in the order of 10 micrometres.

Preferably the layers 710, 720, 730, 740 are epitaxially formed, preferably from the nitride mesa 550. The layer 750 can be deposited by CVD (chemical vapour deposition) or MOCVD (metal organic chemical vapour deposition).

The structures in FIGS. 13A and 13C can undergo additional steps, in particular to remove the pads.

One considerable advantage of the proposed method is that it allows mesas 550 of a large thickness, typically greater than 5 micrometres, preferably in the order of 10 micrometres, to be produced with very few or no fractures, dislocations and with very little or no deformation of the wafer. This large thickness of the nitride layer reduces vertical leakage and increases breakdown voltage. The proposed method thus considerably improves the performance levels of power transistors such as HEMTs.

Figure 14A:
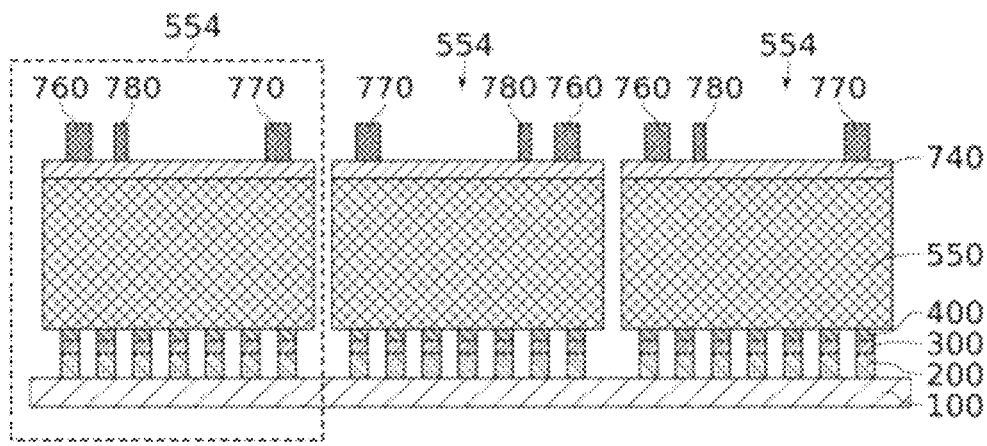
FIG. 14A to 14B diagrammatically show examples of transistors produced on the same wafer from nitride mesas supported by pads.

FIG. 14A shows a substrate 100 on which a plurality of devices rest, each intended to form a HEMT 554. Each transistor 554 has a source 760, a drain 770 and a gate 180. The advantage of this embodiment is that it is particularly easy to implement.

Figure 14B:
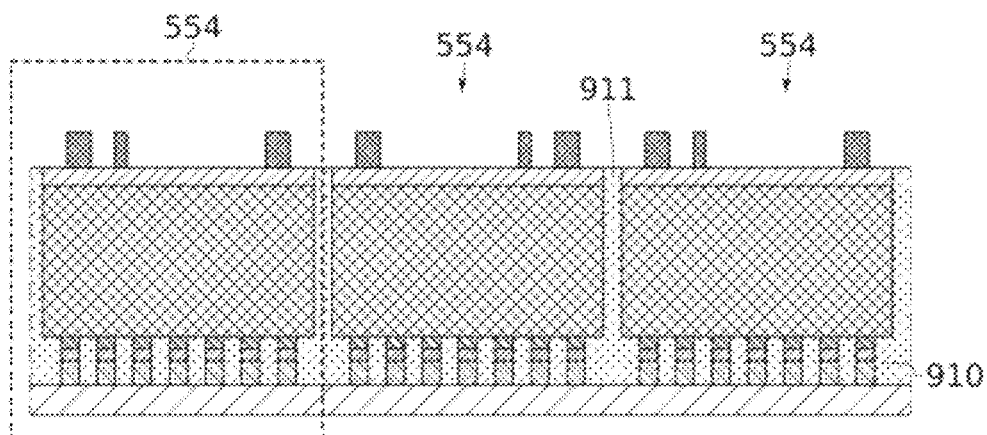

FIG. 14B shows an alternative embodiment, wherein a dielectric layer separates the different transistors 554. This dielectric layer 910 is, for example, deposited by centrifugation and can be of the SOG (spin-on-glass) type. This dielectric layer 910 mechanically stabilises the mesas 550.

This dielectric layer 910 also electrically isolates the different transistors 554, in particular when they are in operation. As shown in FIG. 14B, a portion 911 of the dielectric layer 910 effectively separates neighbouring transistors 554. This prevents, for example, short-circuits between sources 760 facing one another or between drains 770 facing one another, as shown in FIG. 14A. More specifically, the sources and drains of two neighbouring transistors 554 are preferably disposed symmetrically. As will be seen hereinbelow with reference to FIG. 16A to 17, this facilitates the subsequent connection of the sources 760 and drains 770. In particular, this allows the high and low voltages to be at the same position.

One example embodiment of a transistor 554 will now be described with reference to FIG. 15A to 15D. This transistor can be identical to that shown in FIG. 14B.

Figure 15A:
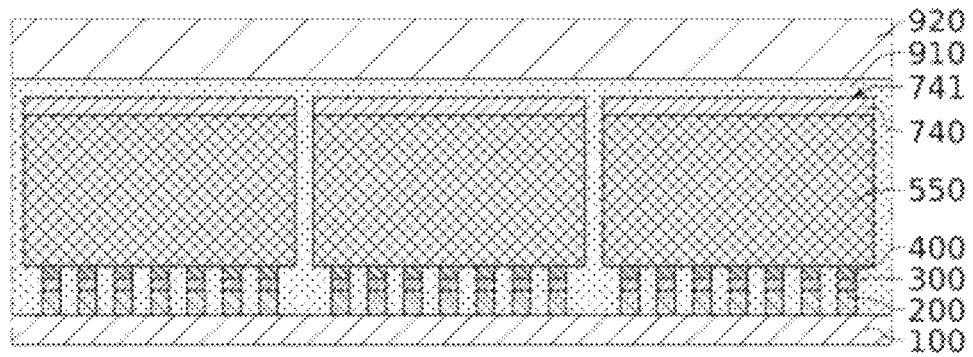
FIG. 15A to 15D diagrammatically show steps in an example method for producing transistors, for example vertical transistors of the HEMT type, on a wafer from nitride mesas supported by pads.

FIG. 15A shows the substrate 100 overlaid by the pads 200, 300, 400 which support the mesa 550 and at least the barrier layer 740. It goes without saying that at least one and preferably a plurality of the previously described layers 710, 720, 730, 750 can be present. Preferably, a dielectric layer 910 is deposited as described with reference to FIG. 14B. This dielectric layer 910 covers the free face of each of the structures 554. A handle substrate 920 is then attached to the free face of the dielectric layer 910.

Figure 15B:
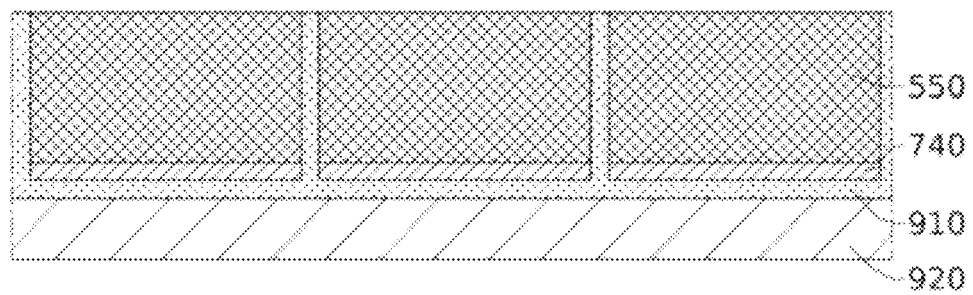

As shown in FIG. 15B, the substrate 100 and the pads are then removed. This can take place, for example, by etching, grinding or chemical-mechanical polishing (CMP). This removal is continued until one face of the nitride mesas 550 is made accessible. Preferably, prior to this removal by thinning, the stack will have been turned over.

Figure 15C:
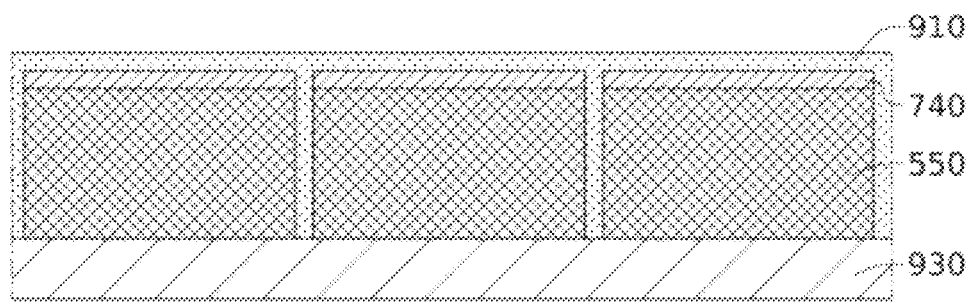

As shown in FIG. 15C, an additional substrate 930 is then attached to the accessible face of the nitride mesas 550. The handle substrate 920 is then removed. The additional substrate 930 is retained. This can be a final substrate.

The protective dielectric layer 910 is then removed to make the barrier layer 740 accessible.

The sources 760, drains 770 and gates 780 can then be formed to finalise the transistors 554.

Preferably, the portions of dielectric layer 910 located between two transistors 554 are retained.

Figure 15D:
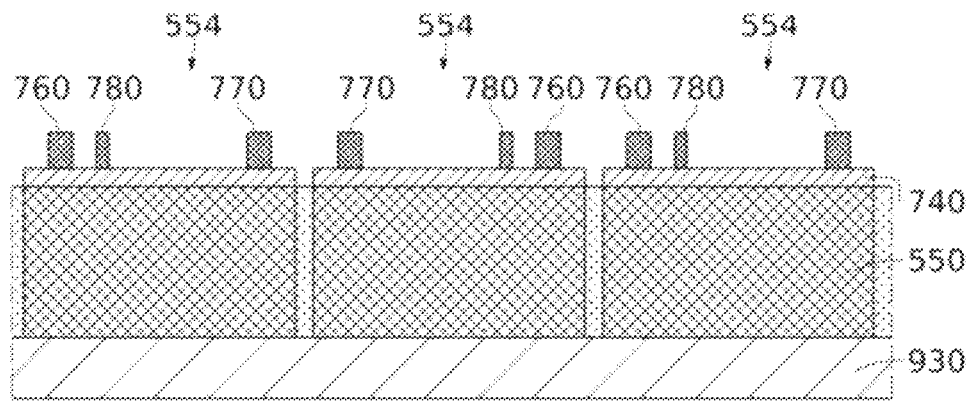
Figure 16A:
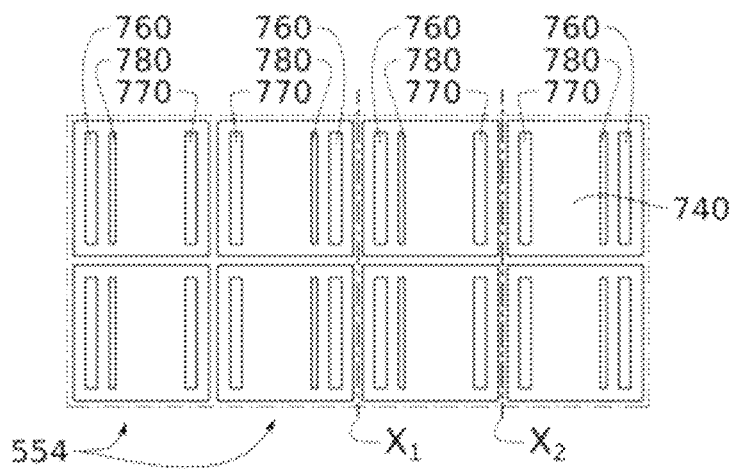
FIG. 16A shows an overhead view of the wafer in FIG. 15D carrying the transistors.

FIG. 16A shows an overhead view of the structure shown in FIG. 15D.

This FIG. 16A further highlights the symmetrical disposition of the sources 760, drains 770 and gates 780 belonging to two adjacent transistors 554.

Thus, the axis X1 is an axis of symmetry for the disposition of the sources 760, drains 770 and gates 780 belonging to two adjacent transistors 554, whereas the axis X2 is an axis of symmetry for the disposition of the sources 760, drains 770 and gates 780 belonging to two other adjacent transistors 554.

Figure 16B:
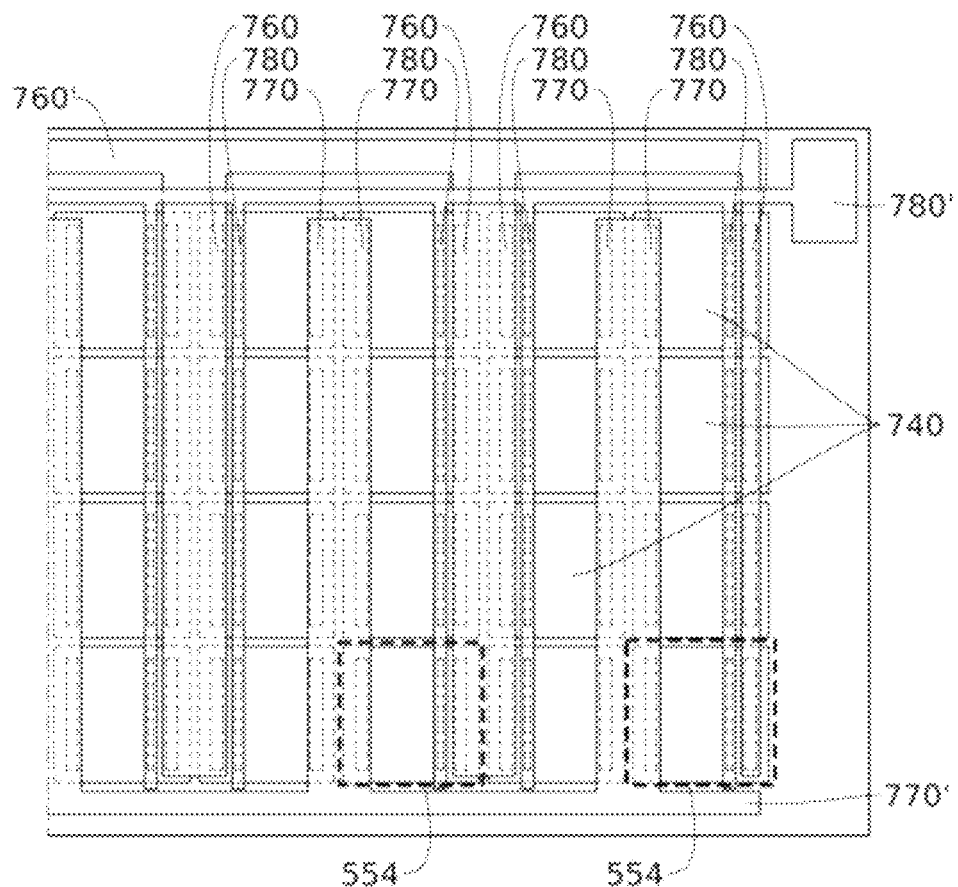
FIG. 16B shows an overhead view of the wafer in FIG. 15D carrying the transistors after the electrical tracks for connecting the sources, drains and gates have been produced.

As shown in FIG. 16B, this symmetry between two other neighbouring transistors 554 facilitates:
the connection of the sources 760 with a common electrical contact point 760',
the connection of the drains 770 with a common electrical contact point 770',
the connection of the gates 780 with a common electrical contact point 780'.

Figure 17:
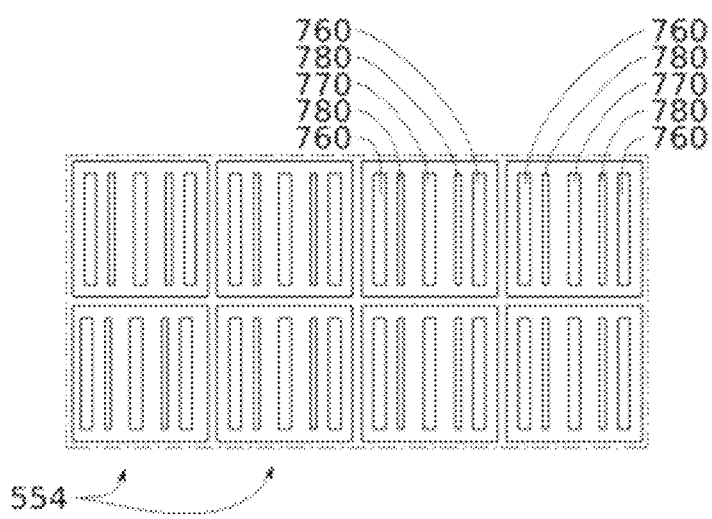
FIG. 17 shows an overhead view of a wafer carrying transistors according to an alternative embodiment to that shown in FIGS. 15D and 16A.

FIG. 17 shows an overhead view of an alternative structure to that shown in FIGS. 15D and 16A. In this alternative structure, each transistor 554 has a central drain 770, as well as sources 760, and two gates 780. The sources 760 are disposed on either side of the drain 770. The gates 780 are also disposed on either side of the drain 770.

It is clear from the above description that the present invention proposes a particularly effective solution for obtaining a plurality of epitaxially-grown mesas, each intended to form a micro-LED with a considerably reduced defect density.

The invention is not limited to the embodiments described hereinabove, and includes all the embodiments covered by the claims.

The invention claimed is:

1. A method for obtaining a plurality of mesas, each mesa being made at least in part of a nitride (N), wherein the method comprises the following successive steps of:
providing a stack comprising a substrate and at least the following layers disposed in succession from the substrate:
a flow layer, made of a material with a glass transition temperature, the flow layer having a glass transition temperature $T_{glass\ transition}$, and
a crystalline layer, which is different from the flow layer,
forming pads by etching through the crystalline layer but only through a portion of the flow layer such that:
a bottom portion of the flow layer is retained between the pads,
each pad includes at least a flow section, formed by at least one portion of the flow layer and being directly connected to the bottom portion of the flow layer between the pads, and a crystalline section, formed by the crystalline layer and overlying the flow section, and the pads are distributed over the substrate so as to form a plurality of sets of pads, epitaxially growing a crystallite on at least some of said pads and continuing the epitaxial growth of the crystallites until the crystallites carried by the adjacent pads of a same set coalesce, so as to form a nitride mesa on each set, the epitaxial growth being performed at a temperature $T_{epitaxy}$, such that:

$T_{epitaxy} \geq k1 \times T_{glass\ transition}$, where $k1 \geq 0.8$, and interrupting the epitaxial growth of the crystallites before crystallites belonging to two separate sets start to coalesce, so that the formed mesas are spaced apart from one another, wherein, after the epitaxial growth and formation of the mesas, an adjacent pair of pads has a space formed therebetween and a side surface of the flow section of each pad of the pair of pads forms part of a side surface of the space.

2. The method according to claim 1, wherein a distance D between two adjacent pads of the same set is less than a distance W1 between two adjacent pads of two different sets, where W1>D.

3. The method according to claim 1, wherein:
W1 is a distance between two adjacent pads belonging to two separate sets,
W2 is a distance between two adjacent mesas, and
wherein $W1 \geq k5 \times W2$, where $k5=1.5$.

4. The method according to claim 1, wherein each pad has a cross-section with a maximum dimension $d_{pad}$ of between 10 and 500 nm ($10^{-9}$ meters), the maximum dimension $d_{pad}$ being measured in a plane parallel to a plane (xy) wherein a top face of the substrate mainly extends.

5. The method according to claim 1, wherein each mesa has a cross-section with a maximum dimension $d_{mesa}$ of between 0.5 and 10 μm ($10^{-6}$ meters), the maximum dimension $d_{mesa}$ being measured in a plane parallel to a plane (xy) wherein a top face of the substrate mainly extends.

6. The method according to claim 1, wherein the pads of a same set are distributed on the substrate in a periodic manner according to a period $p_{pad}$, where 200 nm $\leq p_{pad} \leq$ 2,000 nm.

7. The method according to claim 1, wherein the pads of the same set are distributed on the substrate in a non-periodic manner.

8. The method according to claim 1, wherein the flow layer is made of a material selected from:
a silicon oxide SixOy, where x and y are integers,
a glass,
a borosilicate glass, and
a borophosphosilicate glass (BPSG).

9. The method according to claim 1, wherein $T_{epitaxy} \leq k2 \times T_{min\ melting}$, $T_{min\ melting}$ being a lowest melting temperature among melting temperatures of the sections forming the pads, where $k2 \leq 0.9$.

10. The method according to claim 1, wherein the pads comprise at least one buffer layer overlying the crystalline layer, and made of a different material than the nitride mesas.

11. The method according to claim 10, wherein the nitride mesas are made of gallium nitride (GaN) and the buffer layer is made of aluminum nitride (AlN).

12. The method according to claim 1, wherein providing said stack comprises providing an elaborate substrate of a silicon-on-insulator (SOI) type comprising a base substrate successively overlaid by an oxide layer forming said flow layer and a semiconductor layer forming said crystalline layer.

13. The method according to claim 1, wherein the flow section has a height $e_{220}$ that is such that $e_{220} \geq 0.1 \times d_{pad}$, Where $d_{pad}$ is a diameter of the pad or an edge-to-edge distance of the pad measured at the flow section and in a direction parallel to a plane (xy) wherein a top face of the substrate mainly extends.

14. The method according to claim 1, wherein the pads have a height $H_{pad}$, and wherein two adjacent pads are separated by a distance D, such that:
$H_{pad}/D<2$.

15. The method according to claim 1, wherein each pad has a top face and wherein the epitaxial growth of the crystallites takes place at least in part from said top face.

16. The method according to claim 1, further comprising, after said pads are formed, and before said epitaxial growth of the crystallites, a step of thinning the flow sections by selectively etching the flow sections at least with respect to the crystalline sections.

17. The method according to claim 1, further comprising a step of forming a barrier layer, on the nitride mesas, followed by a step of forming at least one source, drain, and gate on the barrier layer.

18. A method for forming a plurality of light-emitting diodes (LEDs) comprising successive steps of:
forming the plurality of mesas, to form an LED, the plurality of mesas being obtained by implementing the method according to claim 1, and
producing, in the mesas, at least one from among at least one p/n junction, and at least one quantum well.

19. A microelectric device, comprising:
a substrate overlaid by a plurality of mesas, each made of a nitride, and
a plurality of pads extending between the substrate and the plurality of mesas, each mesa being fully supported by a set of pads from among said plurality of pads,
wherein each pad comprises at least:
a flow section, having a glass transition temperature $T_{glass\ transition}$, and
a crystalline section, formed by a crystalline material, the flow section and the crystalline section being disposed in succession from the substrate,
the device further includes a bottom flow layer between the pads, wherein the flow section of each pad is directly connected to the bottom flow layer,
an adjacent pair of pads has a space formed therebetween and a side surface of the flow section of each pad of the pair of pads forms part of a side surface of the space, and
the material of the flow section and said nitride are chosen such that:
$T_{epitaxy} \geq k1 \times T_{glass\ transition}$, where $k1=0.8$, and
$T_{epitaxy}$ being a minimum temperature for epitaxial formation of said nitride from which the mesas are made.

20. An optoelectronic system comprising the microelectronic device according to claim 19, wherein at least some of the mesas partially form at least one light-emitting diode (LED).

21. A system comprising the microelectronic device according to claim 19, wherein at least some of the mesas partially form at least one transistor or a high electron mobility transistor (HEMT).

22. The method according to claim 1, wherein the nitride (N) is obtained from the at least one material selected from gallium (Ga), indium (In), and aluminum (Al).

23. The method according to claim 5, wherein $0.8\ \mu m \leq d_{mesa} \leq 3\ \mu m$.

24. The method according to claim 11, wherein the pads comprise, prior to the step of epitaxially growing the nitride mesas, at least one seed layer, overlying said buffer layer and made of gallium nitride (GaN).

* * * * *